(12) United States Patent
Hussein et al.

(10) Patent No.: US 12,282,252 B2
(45) Date of Patent: Apr. 22, 2025

(54) SYSTEMS, DEVICES, AND METHODS FOR GENERATING DROP PATTERNS

(71) Applicant: CANON KABUSHIKI KAISHA, Tokyo (JP)

(72) Inventors: Ahmed M. Hussein, Austin, TX (US); Andrew Robert Eckert, Pflugerville, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 241 days.

(21) Appl. No.: 18/172,212

(22) Filed: Feb. 21, 2023

(65) Prior Publication Data

US 2024/0280896 A1  Aug. 22, 2024

(51) Int. Cl.
G03F 7/00 (2006.01)

(52) U.S. Cl.
CPC .................... *G03F 7/0002* (2013.01)

(58) Field of Classification Search
CPC ............ G03F 7/0002; B41J 2/01; B41J 3/407
See application file for complete search history.

(56) References Cited

U.S. PATENT DOCUMENTS

| | | | |
|---|---|---|---|
| 6,074,430 A | 6/2000 | Tsukiboshi | |
| 6,292,809 B1 | 9/2001 | Edelman | |
| 6,936,194 B2 | 8/2005 | Watts | |
| 7,014,295 B2 | 3/2006 | Hickman | |
| 8,066,930 B2 | 11/2011 | Sreenivasan | |
| 8,119,052 B2 | 2/2012 | Schumaker | |
| 8,232,903 B2 | 7/2012 | Hsu | |
| 8,349,241 B2 | 1/2013 | Sreenivasan | |
| 8,512,797 B2 | 8/2013 | Schumaker | |
| 8,586,126 B2 | 11/2013 | Schumaker | |
| 9,377,777 B2 | 6/2016 | Nakagawa | |
| 9,483,588 B2 | 11/2016 | Nehme | |
| 9,651,860 B2 | 5/2017 | Aihara | |
| 9,651,862 B2 | 5/2017 | Fletcher | |
| 9,804,503 B2 | 10/2017 | Tanaka | |
| 10,029,456 B2 | 7/2018 | Nakagawa | |
| 10,120,276 B2 | 11/2018 | Schumaker | |
| 10,192,793 B2 | 1/2019 | Izawa | |
| 10,259,164 B2 | 4/2019 | Bader | |
| 10,417,820 B2 | 9/2019 | Samavati | |
| 10,707,078 B2 | 7/2020 | Tamura | |
| 11,400,619 B2 | 8/2022 | Shiode | |

(Continued)

*Primary Examiner* — Deoram Persaud
(74) *Attorney, Agent, or Firm* — Canon U.S.A., Inc. IP Division

(57) ABSTRACT

Some devices, systems, and methods calculate a transition region periodicity as a least a common multiple of a first periodicity of a first uniform-feature segment and a second periodicity of a second uniform-feature segment; determine a plurality of periodic elements of the transition region based on the transition region periodicity; determine a number of drops for each periodic element of the plurality of periodic elements of the transition region based on a volume requirement of the periodic element; and select, for each periodic element of the plurality of periodic elements of the transition region, a transition-region drop pattern that has the number of drops and that minimizes a metric that is a weighted sum of inverse distances between drops in the periodic element and drops in the first uniform-feature segment and the second uniform-feature segment that are adjacent to the periodic element.

20 Claims, 17 Drawing Sheets

(56) References Cited

U.S. PATENT DOCUMENTS

| | | |
|---|---|---|
| 11,474,441 B2 | 10/2022 | Hussein |
| 11,556,055 B2 | 1/2023 | Hussein |
| 11,567,414 B2 | 1/2023 | Hussein |
| 11,635,684 B1 * | 4/2023 | Ghariehali ............ G03F 7/0002 |
| | | 101/450.1 |
| 2005/0106321 A1 | 5/2005 | McMackin |
| 2007/0005550 A1 | 1/2007 | Klein |
| 2007/0231981 A1 | 10/2007 | Sreenivasan |
| 2007/0278712 A1 | 12/2007 | Okushima |
| 2009/0115110 A1 | 5/2009 | Schumaker |
| 2010/0096470 A1 | 4/2010 | Truskett |
| 2010/0097590 A1 | 4/2010 | Schumaker |
| 2010/0098859 A1 | 4/2010 | Schumaker |
| 2013/0020281 A1 * | 1/2013 | Wakamatsu ........... B41J 2/2135 |
| | | 427/277 |
| 2015/0234287 A1 | 8/2015 | Tanaka |
| 2016/0288404 A1 | 10/2016 | Schumaker |
| 2017/0252775 A1 | 9/2017 | Tamura |
| 2018/0164678 A1 * | 6/2018 | Fletcher ................. G03F 7/0002 |
| 2018/0218951 A1 * | 8/2018 | Izawa ................... H10B 43/30 |
| 2018/0329315 A1 | 11/2018 | Hirano |
| 2019/0351589 A1 | 11/2019 | Aihara |
| 2020/0078989 A1 | 3/2020 | Shiode |
| 2020/0292934 A1 | 9/2020 | Simpson |
| 2020/0401040 A1 | 12/2020 | Khusnatdinov |
| 2021/0157236 A1 * | 5/2021 | Khusnatdinov ......... G03F 7/095 |
| 2021/0370558 A1 | 12/2021 | Ishida |
| 2021/0397082 A1 | 12/2021 | Hussein |
| 2021/0405547 A1 | 12/2021 | Hussein |
| 2022/0091500 A1 * | 3/2022 | Tavakkoli Kermani Ghariehali .............. G06F 30/12 |
| 2022/0382170 A1 | 12/2022 | Hussein |
| 2023/0033557 A1 | 2/2023 | Rafferty |
| 2024/0006209 A1 * | 1/2024 | Patel ................. H01L 21/67288 |

\* cited by examiner

SYSTEMS, DEVICES, AND METHODS FOR GENERATING DROP PATTERNS

BACKGROUND

Technical Field

This application generally concerns generating drop patterns for imprint lithography and inkjet-based adaptive planarization.

Background

Nano-fabrication includes the fabrication of very small structures that have features that are 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and increasing throughput while also allowing continued reduction of the minimum feature dimensions of the structures formed.

Some nano-fabrication techniques are commonly referred to as nanoimprint lithography. Nanoimprint lithography is useful in a variety of applications including, for example, fabricating one or more layers of integrated devices. Examples of integrated devices include CMOS logic, microprocessors, NAND Flash memory, NOR Flash memory, DRAM memory, MRAM, 3D cross-point memory, Re-RAM, Fe-RAM, STT-RAM, MEMS, optical components, and the like.

Some nanoimprint lithography techniques form a feature pattern in a formable material (polymerizable) layer and transfer a pattern corresponding to the feature pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into or onto the substrate that corresponds to the pattern in the solidified layer.

Additionally, planarization techniques are useful in fabricating semiconductor devices. For example, the process for creating a semiconductor device may include repeatedly adding and removing material to and from a substrate. This process can produce a layered substrate with an irregular height variation (i.e., relief pattern), and, as more layers are added, the substrate's height variation can increase. The height variation negatively affects the ability to add further layers to the layered substrate. Moreover, semiconductor substrates (e.g., silicon wafers) themselves are not always perfectly flat and may include an initial surface height variation (i.e., relief pattern). One technique to address height variations is to planarize the substrate between layering procedures. A planarization technique sometimes referred to as inkjet-based adaptive planarization (IAP) involves dispensing a variable drop pattern of polymerizable material between the substrate and a superstrate, where the drop pattern varies depending on the substrate's relief pattern. A superstrate is then brought into contact with the polymerizable material, after which the material is polymerized on the substrate, and the superstrate removed.

Various lithographic patterning techniques benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL), planarization improves feature filling and CD control after pattern transfer.

And a substrate with polymerized material can be further subjected to known procedures and processes for device (article) fabrication, including, for example, curing, oxidation, layer formation, deposition, doping, planarization, etching, formable material removal, dicing, bonding, packaging, and the like.

SUMMARY

Some embodiments of a drop-pattern-generation method, that includes determining positions of drops in a transition region between a first uniform-feature segment and a second uniform-feature segment, comprise calculating a transition region periodicity as a least a common multiple of a first periodicity of a first uniform-feature segment and a second periodicity of a second uniform-feature segment; determining a plurality of periodic elements of the transition region based on the transition region periodicity; determining a number of drops for each periodic element of the plurality of periodic elements of the transition region based on a volume requirement of the periodic element; and selecting, for each periodic element of the plurality of periodic elements of the transition region, a transition-region drop pattern that has the number of drops and that minimizes a metric that is a weighted sum of inverse distances between drops in the periodic element and drops in the first uniform-feature segment and the second uniform-feature segment that are adjacent to the periodic element.

Some embodiments of a system comprise one or more computer-readable media and one or more processors in communication with the one or more computer-readable media. Also, the one or more processors and the one or more computer-readable media are configured to: calculate a number of drops for at least part of a transition region based on a volumetric requirement of the at least part of the transition region and a drop volume, wherein the transition region is a region between a first uniform-feature segment and a second uniform-feature segment; and generate a transition-region drop pattern that has the number of drops and that maximizes distances between drops in the at least part of the transition region, drops in a first drop pattern, of the first uniform-feature segment, that are adjacent to the at least part of the transition region, and drops in a second drop pattern, of the second uniform-feature segment, that are adjacent to the at least part of the transition region.

Some embodiments of a method comprise selecting a part of a transition region, wherein the transition region is a region between a first uniform-feature segment and a second uniform-feature segment, and wherein the selecting is based on a first drop pattern of the first uniform-feature segment and on a second drop pattern of the second uniform-feature segment, and wherein the part of the transition region has a length that is equal to an integer multiple of both a periodicity of the first drop pattern and a periodicity of the second drop pattern; calculating a number of drops for the part of a transition region based on a volumetric requirement of the part of the transition region and on a drop volume; and generating a transition-region drop pattern that is based on the number of drops and that maximizes distances between drops in the part of the transition region, drops in the first drop pattern that are adjacent to the part of the transition region, and drops in the second drop pattern that are adjacent to the part of the transition region.

DESCRIPTION

Figure 1:
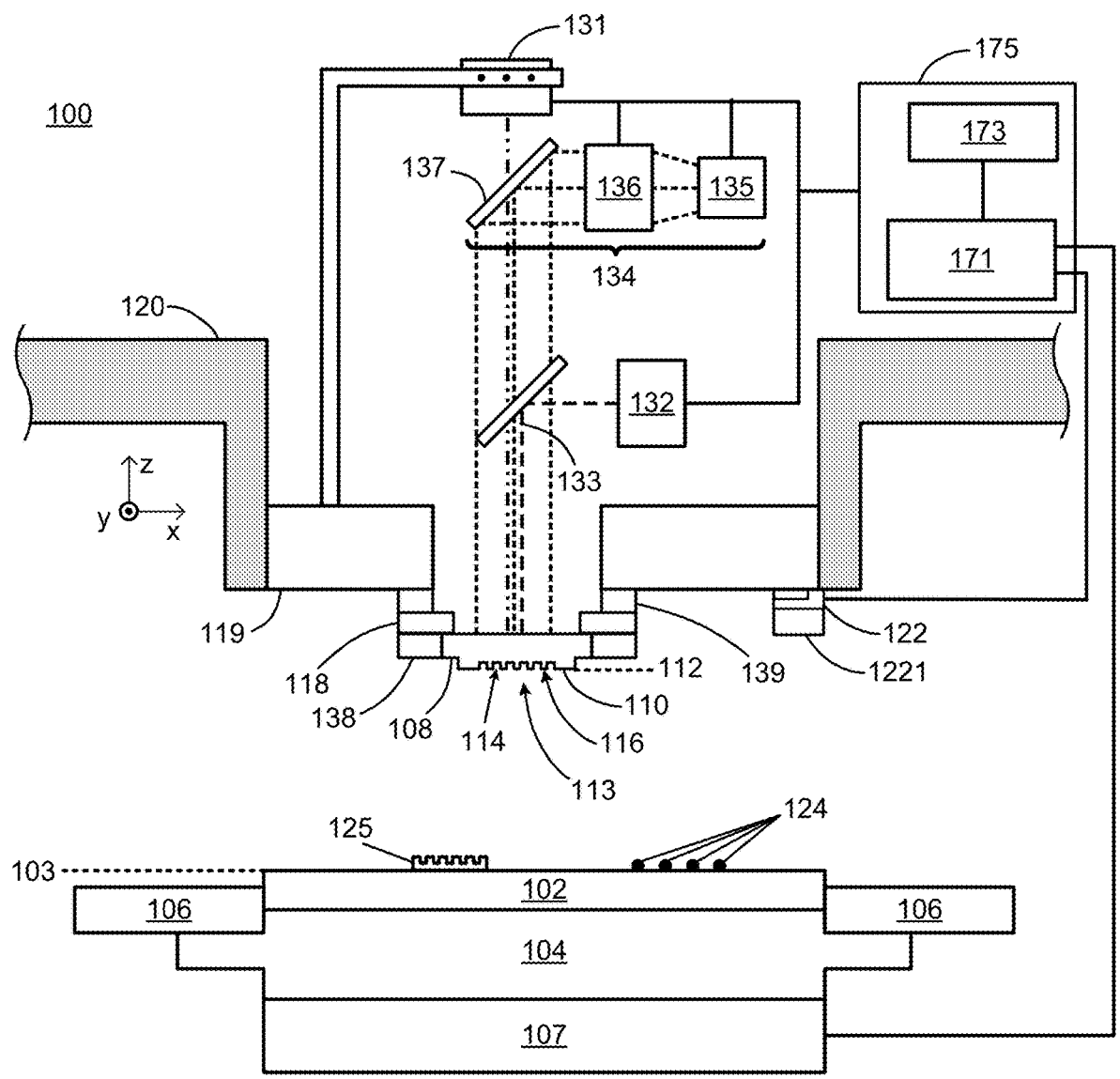
FIG. 1 illustrates an example embodiment of an imprint system.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

As used herein, the conjunction "or" generally refers to an inclusive "or," though "or" may refer to an exclusive "or" if expressly indicated or if the context indicates that the "or" must be an exclusive "or." And, as used herein, the terms "first," "second," and so on, do not necessarily denote any ordinal, sequential, or priority relation and may be used to more clearly distinguish one member, operation, element, group, collection, set, etc. from another without expressing any ordinal, sequential, or priority relation.

Furthermore, in this description and the drawings, an alphabetic suffix on reference numerals may be used to indicate a specific instance of the feature identified by the reference numerals. For example, the imprint fields in a group of imprint fields may be identified with the reference numerals 141 when a particular imprint field is not being distinguished. However, 141A may be used to identify a specific imprint field when the specific imprint field is being distinguished from the rest of the imprint fields 141.

FIG. 1 illustrates an example embodiment of an imprint system 100 (e.g., a nanoimprint lithography system). Also, in some embodiments, the imprint system 100 is implemented as a single imprint device. When operating, the imprint system 100 deposits drops of formable material 124 (e.g., resist, functional material, etc.) on a substrate 102 (e.g., a wafer, replica template, etc.) and forms a patterned layer 125, which has a relief pattern, in the formable material 124 in an imprint field on the substrate 102 by using a template 108 to imprint the formable material 124 on the substrate 102.

The imprint system 100 may be configured to perform high-throughput lithography (e.g., high-throughput nanoimprint lithography), which requires that the spread time of the formable material 124 under the template 108 be minimized. This requires the optimization of the placement of the drops of formable material 124 for fast filling of the features of the template 108. For fast filling of template features, the drops should be arranged so as to maximize the use of capillary forces of the formable material 124 that is trapped between the substrate 102 and the template 108. Usually, drop arrangements in the form of uniform grids (grid drop patterns) in which drops are placed in a periodically repeating two-dimensional array give the best fast-filling performance. The applicant has also found that drop arrangements in the form of uniform grids often give better filling performance of uniform-feature segments. The choice of the grid drop pattern depends on the template's feature density and orientation. The template and/or substrate typically includes features that are much smaller than the drops of formable material. These features may include long narrow lines (typically referred to as gratings) which can influence a preferential direction in which the drops of formable material spread. This preferential direction is referred to as orientation. A uniform grid drop pattern that covers the entire imprint field would be the ideal arrangement for an imprint field that has uniform features (e.g., blank imprint fields, imprint fields that are spanned by uniform gratings, etc.).

However, imprint fields may consist of multiple feature combinations. For example, an imprint field may include uniform-feature segments, which are segments (areas) that have statistically uniform features of the same feature density and orientation. These uniform feature segments are statistically uniform on a length scale (e.g., 5 μm) that is less than a diameter of the drops of formable material (e.g., 100 μm). Between the uniform-feature segments, there are areas that lack uniform features but that may contain other non-repeating features. These areas are referred to herein as transition regions, and they are situated along the boundaries between uniform-feature segments. While the fast filling of uniform-feature segments is straightforward once an appropriate drop pattern (e.g., grid drop pattern) is selected, using a grid drop pattern of a uniform-feature segment to fill an adjacent transition region does not guarantee the fast filling of the transition region because the grid drop pattern is selected to fill the uniform-feature segment's features, which may be different than those of the transition region. Thus, the imprint system 100 may use a drop pattern that is configured to fast fill both uniform-feature segments and transition regions. The drop pattern may be generated by the imprint system 100 or by other devices, such as one or more drop-pattern-generation devices.

The template 108 of the imprint system 100 includes a mold 110 (e.g., a mesa) that has pattern area 113 that includes a pattern surface 112. And a single mold 110 may be used to imprint the formable material 124 in a plurality of imprint fields on a single substrate 102 or a plurality of substrates 102. In some embodiments, the substrate 102 is in the form of a wafer.

Figure 2A:
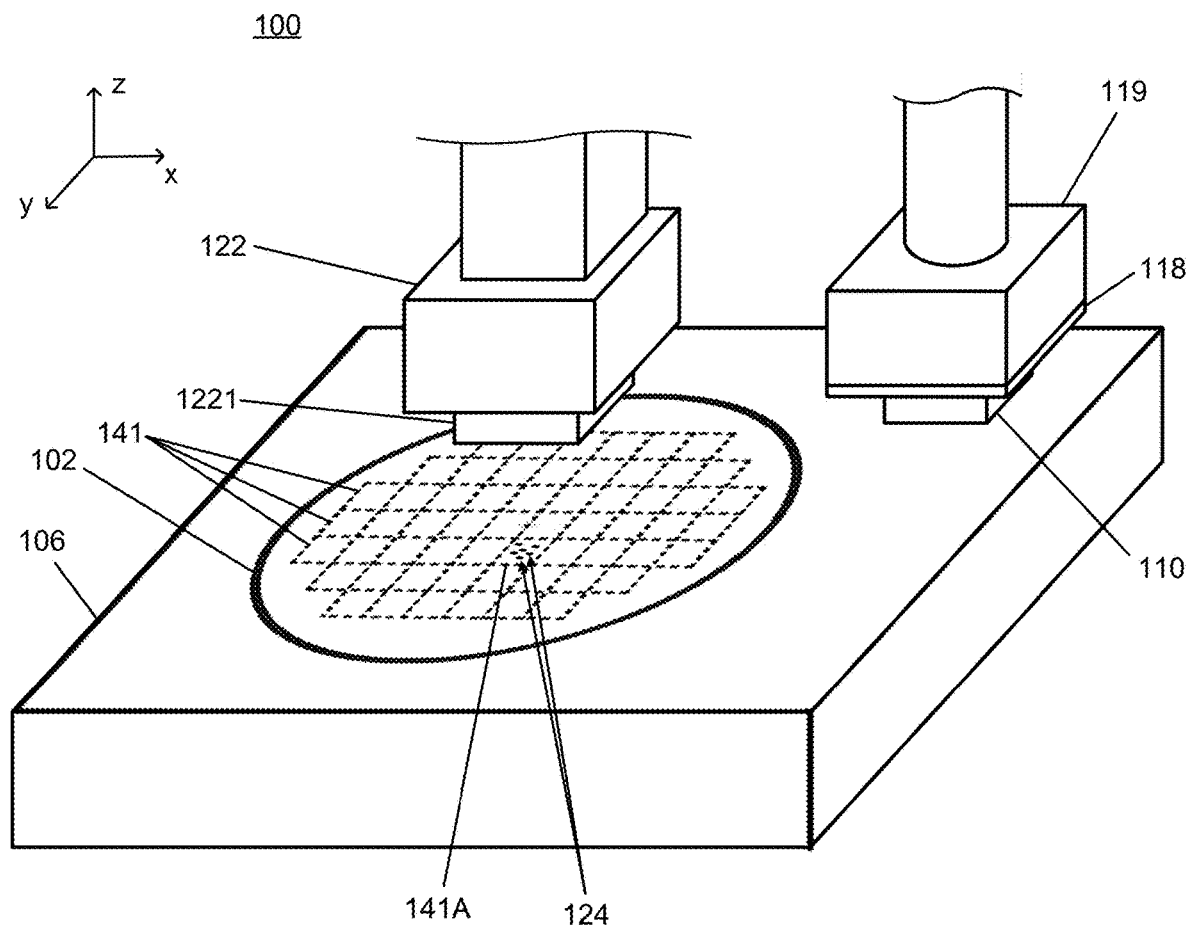
FIG. 2A illustrates a perspective view of an example embodiment of an imprint system.

FIG. 2A illustrates a perspective view of an example embodiment of an imprint system 100. This embodiment of an imprint system 100 includes a substrate 102, an applique 106, a fluid dispenser 122, a mesa 110, a template chuck 118, and an imprint head 119. Also, FIG. 2A illustrates a plurality of imprint fields 141 on the substrate 102. Additionally, the fluid dispenser 122 has deposited drops of formable material 124 on an imprint field 141A.

In FIGS. 1 and 2A, the perimeter of the substrate 102 is surrounded by an applique 106. The applique 106 may be configured to stabilize the local gas environment beneath the template 108 or help protect the pattern surface 112 from particles, for example when the template 108 is not above the substrate surface 103. Furthermore, an upper surface of the applique 106 may be below (e.g., as shown in FIG. 1) or coplanar with the substrate surface 103.

Also, the substrate 102 is coupled to a substrate chuck 104, which also supports the applique 106. Examples of substrate chucks 104 include the following: vacuum chucks, pin-type chucks, groove-type chucks, electrostatic chucks, and electromagnetic chucks. In some embodiments, such as the embodiment shown in FIG. 1, the applique 106 is mounted on the substrate chuck 104 without any part of the applique being sandwiched between the substrate chuck 104 and the substrate 102. The substrate chuck 104 is supported by the substrate positioning stage 107.

The substrate positioning stage 107 may provide translational or rotational motion along one or more of the x, y, z, θ, and φ-axes. The substrate positioning stage 107, the substrate 102, and the substrate chuck 104 may also be positioned on a base (not shown). Additionally, the substrate positioning stage 107 may be a part of a positioning system or a positioning subsystem.

The template 108 may include a body that includes the mold 110, which extends toward the substrate 102 along the z axis. The mold 110 may have a pattern area 113 that includes a pattern surface 112 thereon. Also, the template 108 may be formed without the mold 110. Thus, in some embodiments, the surface of the template 108 that faces the substrate 102 functions as the mold 110, and the pattern surface 112 is included on the surface of the template 108 that faces the substrate 102. Examples of materials that may constitute the template 108 or the mold 110 include the following: fused-silica, quartz, silicon, organic polymers, siloxane polymers, borosilicate glass, fluorocarbon polymers, metal, and hardened sapphire.

The pattern surface 112 has features that are defined by a plurality of spaced-apart template recesses 114 or template protrusions 116, although some embodiments include other configurations (e.g., a planar surface). The pattern surface 112 defines a pattern that forms the basis (e.g., an inverse) of the relief pattern of the patterned layer 125, which is formed from the drops of formable material 124 on the substrate 102. In some embodiments, the pattern surface 112 is featureless, in which case a planar surface is formed from formable material 124 on the substrate 102. In some embodiments (e.g., embodiments that perform Inkjet-based Adaptive Planarization (IAP)), the pattern surface 112 is featureless and is substantially the same size as the substrate 102, in which case a planar surface is formed from formable material 124 across the entire substrate 102.

The template 108 may be coupled to a template chuck 118. Examples of template chucks 118 include the following: vacuum chucks, pin-type chucks, groove-type chucks, electrostatic chucks, and electromagnetic chucks. The template chuck 118 may be configured to apply a force to the template 108 that varies across the template 108. The template chuck 118 may be coupled to an imprint head 119, which in turn may be moveably coupled to a frame 120 such that the template chuck 118, the imprint head 119, and the template 108 are moveable in at least the z-axis direction. In some embodiments, the template chuck 118, the imprint head 119, and the template 108 are also movable in one or more of the x, y, θ, and φ-axes directions. The imprint system 100 may include one or more motors that move the template 108, the template chuck 118, or the imprint head 119. For example, one or more motors or actuators may rotate the template 108 about an axis in the x-y plane of the template 108. Rotation of the template 108 about an axis in the x-y plane (e.g., a rotation about the x axis, a rotation about the y axis) of the template 108 changes an angle between the x-y plane of the template 108 and the x-y plane of the substrate 102, and may be referred to herein as "tilting" the template 108 with respect to the substrate 102, changing a "tilt" or "tilt angle" of the template 108 with respect to the substrate 102, or adjusting the "tilt" or "tilt angle" of the template 108 relative to the substrate 102.

Figure 2B:
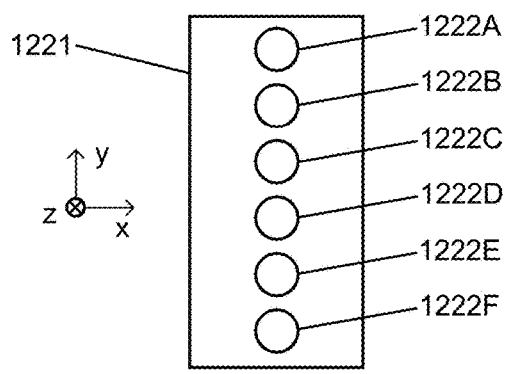
FIG. 2B illustrates an example embodiment of a fluid-dispense head and fluid-dispense ports.

The imprint system 100 also includes a fluid dispenser 122. The fluid dispenser 122 may include a fluid-dispense head 1221, which has fluid-dispense ports. FIG. 2B illustrates an example embodiment of a fluid-dispense head 1221 and fluid-dispense ports 1222. The fluid-dispense ports 1222 may have a fixed configuration such that the fluid-dispense head 1221 and the fluid-dispense ports 1222 move as a unit and do not move independently of each other. Thus, the fluid-dispense ports 1222 may be fixed relative to one another on the fluid-dispense head 1221. The number of fluid-dispense ports 1222 can vary between embodiments. Although the embodiment in FIG. 2B has six fluid-dispense ports 1222, some embodiments have a different number of fluid-dispense ports 1222, such as at least two fluid-dispense ports 1222, at least three fluid-dispense ports 1222, at least four fluid-dispense ports 1222, at least five fluid-dispense ports 1222, at least ten fluid-dispense ports 1222, at least twenty fluid-dispense ports 1222, or over a hundred fluid-dispense ports 1222. In some embodiments, the fluid-dispense ports 1222 include a set of at least three fluid-dispense ports 1222 that lie along a line. In some embodiments, the fluid-dispense head 1221 includes hundreds of fluid-dispense ports 1222 that lie along multiple parallel lines.

The fluid dispenser 122 may also be moveably coupled to the frame 120. In some embodiments, the fluid dispenser 122 and the template chuck 118 share one or more positioning components. And in some embodiments, the fluid dispenser 122 and the template chuck 118 move independently of each other. Also, in some embodiments, the fluid dispenser 122 and the template chuck 118 are located in different subsystems of the imprint system 100, and the substrate 102 is moved between the different subsystems.

When operating, the fluid-dispense ports 1222 of the fluid dispenser 122 deposit drops of liquid formable material 124 onto the substrate 102 according to a drop pattern. The formable material 124 may be, for example, a resist (e.g., photo resist) or another polymerizable material, and the formable material 124 may comprise a mixture that includes a monomer.

Additionally, some embodiments of the imprint system 100 have a dispenser pitch that is fixed in either or both of the x direction and the y direction, and some embodiments of the imprint system 100 have a dispenser pitch that is not fixed in either of the x direction and the y direction. As used herein, the term "pitch" is a distance from the center of a feature to the center of an adjacent feature. Accordingly, a dispenser pitch is a distance from the center of a location where the imprint system 100 can dispense a drop of formable material 124 to the center of an adjacent location where the imprint system 100 can dispense a drop of formable material 124. In Cartesian coordinates, a two-dimensional pattern (a pattern as seen from a top view) can have a pitch in the x direction that corresponds to the distance between the centers of the features as measured in the x direction and can have a pitch in the y direction that corresponds to the distance between the centers of the features as measured in the y direction. And, in some embodiments of the imprint system 100, a y-direction dispenser pitch is fixed by a distance between centers of adjacent fluid-dispense ports 1222, and therefore, the y-direction dispenser pitch is determined by the physical layout of the fluid-dispense ports 1222 in the fluid-dispense head 1221. The x-direction dispenser pitch may be the same as or different from the y-direction dispenser pitch. Also, the x-direction dispenser pitch may be based on the physical layout of the fluid-dispense ports 1222 in the fluid-dispense head 1221, on the physical capabilities of other members of the imprint system 100, or on software that controls the imprint system 100. For example, in some embodiments, the x-direction dispenser pitch can be adjusted by controlling the relative velocity between the substrate 102 and the fluid-dispense ports 1222 during dispensing when the fluid-drop-dispense rate (e.g., dispensings per millisecond) from the fluid-dispense ports 1222 is known. As the relative velocity between the substrate 102 and the fluid-dispense ports 1222 increases, the x-direction dispenser pitch decreases, and as the relative velocity between the substrate 102 and the fluid-dispense ports 1222 decreases, the x-direction dispenser pitch increases, assuming that the fluid-drop-dispense rate remains constant. Because in some embodiments (e.g., the embodiment in FIG. 2B) the y-direction dispenser pitch is dependent on the spacing and organization of the fluid-dispense ports 1222, adjusting the y-direction dispenser pitch can be more challenging than adjusting the x-direction dispenser pitch. In some embodiments, the fluid-dispense ports 1222 can be rotated while they remain in the fixed position relative to one another to achieve a variety of different y-direction dispenser pitches.

The drops of formable material 124 may be dispensed upon the substrate 102 before or after a desired field volume is defined between the pattern surface 112 and the substrate 102, depending on the embodiment. The field volume indicates the volume of formable material 124 required to produce all of the desired features of the patterned layer 125 (e.g., all of the features of the patterned layer 125 in an imprint field). Different fluid dispensers 122 may use different technologies to dispense the drops of formable material 124. When the formable material 124 is jettable, ink-jet-type fluid dispensers 122 may be used to dispense the drops of formable material 124. For example, thermal ink-jetting, microelectromechanical-systems-based (MEMS-based) ink jetting, and piezoelectric ink jetting are technologies for dispensing jettable liquids.

Figure 3:
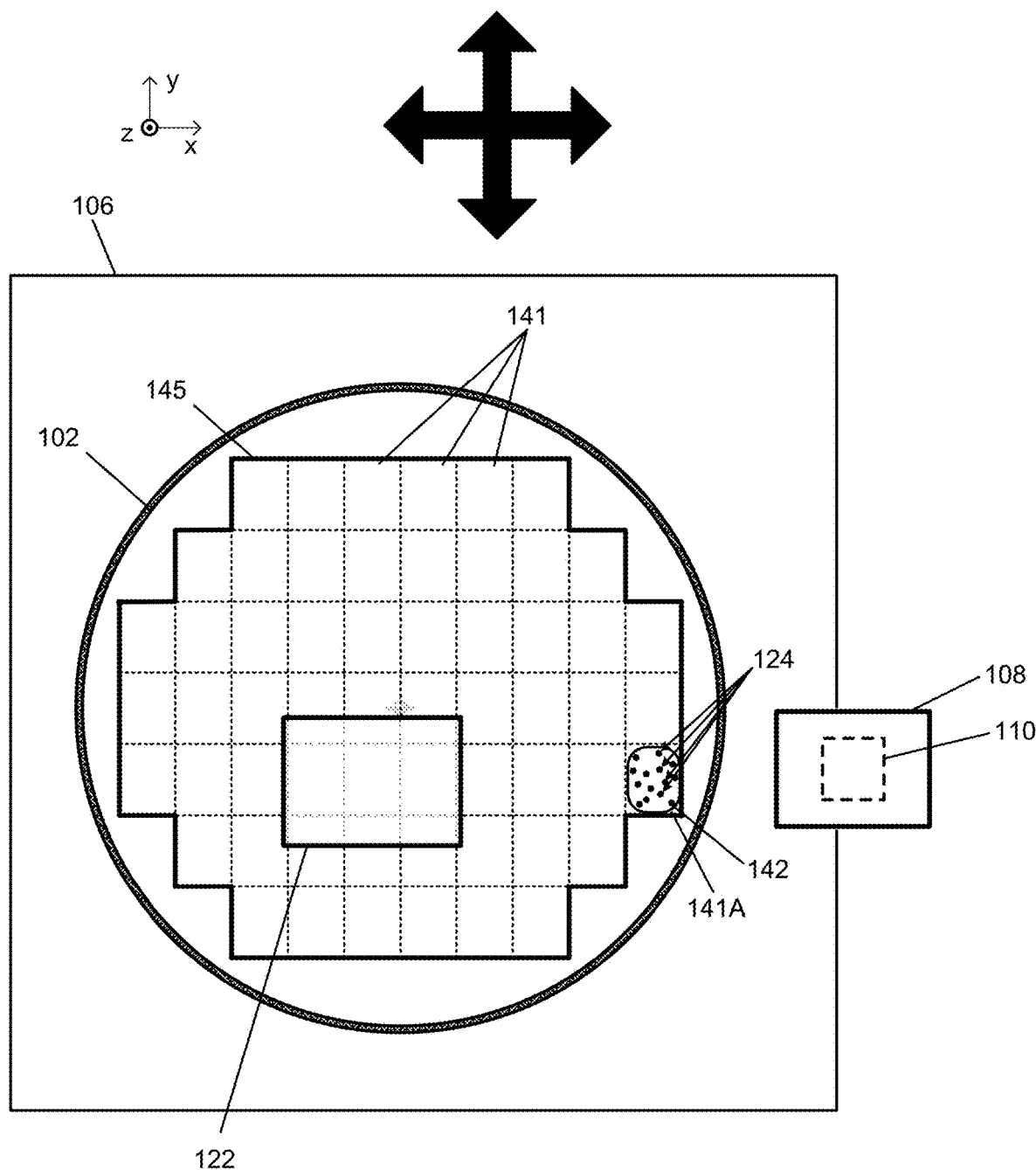
FIG. 3 illustrates a plan view (a view from along the z axis) of an example embodiment of a substrate, an applique, a fluid dispenser, a template, and a drop pattern.

For example, FIG. 3 illustrates a plan view (a view from along the z axis) of an example embodiment of a substrate 102, an applique 106, a fluid dispenser 122, a template 108, and a drop pattern 142. The template 108 includes a mold 110. A drop-pattern-generation field 145 on the substrate 102 may include a plurality of imprint fields 141. The drop-pattern-generation field 145 is the region of the substrate 102 on which drops of formable material 124 will be deposited. In some embodiments, the drop-pattern-generation field 145 has a different shape than the shape of the drop-pattern-generation field 145 illustrated in FIG. 3, and, in some embodiments, the drop-pattern-generation field 145 includes the entire substrate 102.

On each of the imprint fields 141, a respective layer (e.g., a patterned layer, a planar layer) may be formed from the formable material 124. The substrate positioning stage 107, which supports the applique 106 and the substrate 102, can move the applique 106 and the substrate 102 along both the x axis and the y axis. This allows the substrate positioning stage 107 to position each imprint field 141 under the fluid dispenser 122, which deposits drops of formable material 124 on the imprint field 141, and then under the template 108, which forms a pattern (e.g., a patterned layer) in the formable material 124 that was deposited on the imprint field 141. In some embodiments, there is only one imprint field 141 on the substrate surface.

When an imprint field 141 is positioned under the fluid dispenser 122, the fluid dispenser 122 can deposit drops of formable material 124 on the imprint field 141 according to a drop pattern. For example, FIG. 3 shows an imprint field 141A on which drops of formable material 124 have been deposited by the fluid dispenser 122 according to a drop pattern 142. In some embodiments, the fluid dispenser 122 deposits the drops of formable material 124 on each of the imprint fields 141 according to the same drop pattern 142. However, in some embodiments, the fluid dispenser 122 uses different drop patterns for some of the imprint fields 141.

Furthermore, additional formable material may be added to the substrate 102 using various techniques, for example drop dispense, spin-coating, dip coating, chemical vapor deposition (CVD), physical vapor deposition (PVD), thin film deposition, thick film deposition, or the like.

The imprint system 100 also includes an energy source 132 that directs actinic energy along an exposure path 133. The imprint head 119 and the substrate positioning stage 107 may be configured to position the template 108 and the substrate 102 on (e.g., in superimposition with) the exposure path 133. The imprint system 100 also includes at least one imaging device 131 (e.g., camera). The imaging device 131 may be positioned such that an imaging field of the imaging device 131 includes the template 108 and such that the imaging field is in superimposition with at least part of the exposure path 133. For example, the imprint head 119 and the substrate positioning stage 107 may be configured to position the template 108 and a particular imprint field 141 on the exposure path 133, and the imaging device 131 may be positioned such that an imaging field of the imaging device 131 includes the imprint field 141.

Once the drops of formable material 124 have been deposited on the substrate 102, either the imprint head 119, the substrate positioning stage 107, or both varies a distance between the mold 110 and the substrate 102 to define a desired field volume that is filled by the formable material 124. For example, the imprint head 119 may apply a force to the template 108 that moves the mold 110 into contact with the drops of formable material 124 that are on the substrate 102. After the desired field volume is filled with the formable material 124, the energy source 132 produces energy (e.g., actinic radiation (UV)) that is directed along the exposure path 133 to the formable material and that causes the formable material 124 to cure, solidify, or cross-link in conformance to a shape of the substrate surface 103 and the pattern surface 112, thereby defining a patterned layer 125 on the substrate 102. The formable material 124 is cured while the template 108 is in contact with the formable material 124, thereby forming the patterned layer 125 on the substrate 102. Thus, the imprint system 100 uses an imprinting process to form the patterned layer 125, which has recesses and protrusions that are an inverse of the pattern in the pattern surface 112.

The imprinting process may be done repeatedly in a plurality of imprint fields (e.g., the imprint fields 141 in FIG. 2A) that are spread across the substrate surface 103. For example, each of the imprint fields 141 may be the same size as the mold 110 or the same size as only the pattern area 113 of the mold 110. The pattern area 113 of the mold 110 includes the pattern surface 112 that is used to imprint patterns on a substrate 102 (e.g., a region of the pattern surface 112 that includes the template recesses 114 and the template protrusions 116). The pattern area 113 of the mold 110 may include fluid-control features that are used to prevent extrusions. In some embodiments, the substrate 102 has only one imprint field, and the imprint field is the same size as the substrate 102 or as the area of the substrate 102 which is to be patterned (or planarized) with the mold 110. Also, in some embodiments, the imprint fields 141 overlap. Some of the imprint fields 141 may be partial imprint fields that intersect a boundary of the substrate 102.

Figure 4A:
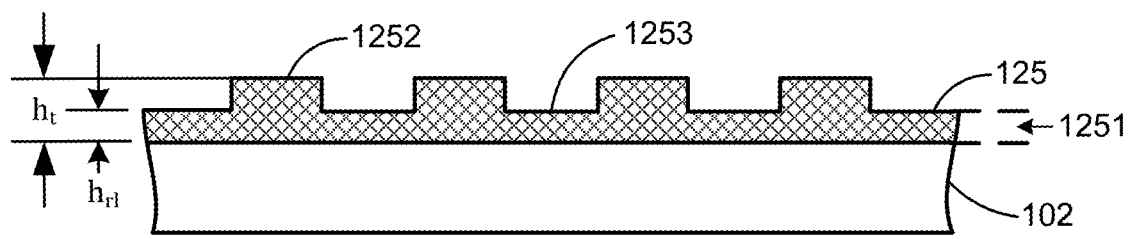
FIG. 4A illustrates an example embodiment of a residual layer.

The patterned layer 125 may be formed such that it has a residual layer that has a residual-layer thickness (RLT), and the patterned layer 125 may also include one or more features, such as protrusions, that extend above the residual layer. For example, FIG. 4A illustrates an example embodiment of a residual layer. In FIG. 4A, a patterned layer 125 has been formed on a substrate 102. The patterned layer 125 includes a residual layer 1251 and a plurality of features that are shown as protrusions 1252 and recesses 1253. The protrusions 1252 have an imprint thickness $h_t$, and the residual layer 1251 has a residual-layer thickness (RLT) $h_{rl}$. These protrusions 1252 match the recesses 114 in the pattern surface 112 of the mold 110.

The patterned layer 125 can be further subjected to known procedures and processes for article (e.g., device) fabrication, including, for example, curing, oxidation, layer formation, deposition, doping, planarization, etching, formable material removal, dicing, bonding, packaging, and the like. Examples of articles include CMOS logic, microprocessors, NAND Flash memory, NOR Flash memory, DRAM memory, MRAM, 3D cross-point memory, Re-RAM, Fe-RAM, STT-RAM, optical components, and MEMS.

Figure 4B:
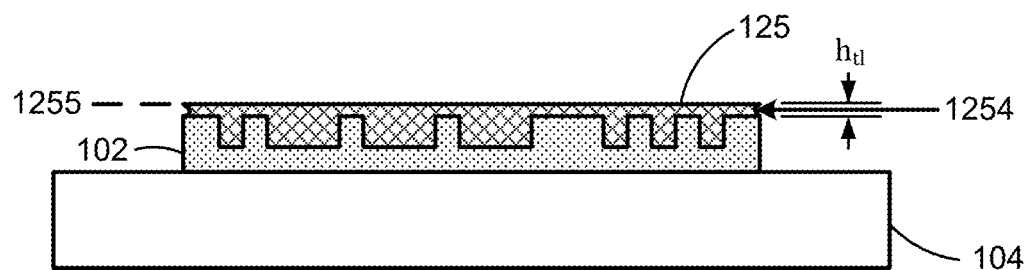
FIG. 4B illustrates an example embodiment of a top layer.

Also, in embodiments of the imprint system 100 that perform IAP, the substrate 102 may have a pattern on its surface, the drops of formable material 124 may form a patterned layer 125 that fills the pattern in the substrate 102, and the patterned layer 125 may have a top layer that extends above the substrate 102 and that has a top-layer thickness (TLT). The upper surface of the top layer may be featureless and planar. For example, FIG. 4B illustrates an example embodiment of a top layer. FIG. 4B shows a patterned layer 125 that has been formed on a substrate 102, which includes recesses and protrusions. The substrate 102 is held by a substrate chuck 104. The patterned layer 125 fills in the recesses and protrusions in the substrate 102. The top layer 1254, which may be referred to as the overburden, is formed above the substrate 102 and has a top-layer thickness (TLT) $h_{tl}$. Also, an upper surface 1255 of the top layer 1254 is featureless and planar.

The imprint system 100 may be regulated, controlled, or directed by one or more processors 171 (e.g., controllers) in communication with one or more other components or subsystems, such as the substrate positioning stage 107, the imprint head 119, the fluid dispenser 122, the energy source 132, or the imaging device 131, and may operate based on instructions in a computer-readable program stored in one or more computer-readable storage media 173. In some embodiments, including the embodiment in FIG. 1, the one or more processors 171 and the one or more computer-readable storage media 173 are included in a lithography-control device 175. The lithography-control device 175 regulates, controls, or directs the operations of the imprint system 100.

Each of the one or more processors 171 may be or may include one or more of the following: a central processing unit (CPU), which may include a microprocessor (e.g., a single core microprocessor, a multi-core microprocessor); a graphics processing unit (GPUs); an application-specific integrated circuit (ASIC); a field-programmable-gate array (FPGA); a digital signal processor (DSP); and other electronic circuitry (e.g., other integrated circuits). For example, a processor 171 may be a purpose-built controller or may be a general-purpose controller that has been specially-configured to be an imprint-system controller.

Examples of computer-readable storage media 173 include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected computer-readable storage device, and an internet-connected computer-readable storage device.

Furthermore, the lithography-control device 175 may operate as a drop-pattern-generation device, which generates one or more drop patterns (dispense patterns). And the lithography-control device 175 may obtain the one or more drop patterns from another device (e.g., a drop-pattern-generation device). For example, the one or more processors 171 may be in communication with a networked computer (e.g., a drop-pattern-generation device) on which analysis is performed and control files, such as drop patterns, are generated. A drop pattern indicates where the fluid dispenser 122 should deposit drops of liquid formable material 124 onto the substrate 102. A drop pattern may be generated based, at least in part, on a field volume or on imprint-field features. Also, to account for imprint-field features, the drop density of the drop pattern may vary across the imprint field. And the drop pattern may have a uniform drop density over regions of the imprint field that have a uniform density (e.g., blank areas, or areas where the imprint-field features have a uniform feature density).

This embodiment of the imprint system 100 also includes various components and features that can be used to compensate for distortions and reduce (or eliminate) overlay errors.

First, the imprint system 100 includes one or more load sensors 139 that detect forces applied to the mold 110 (e.g., applied to specific regions of the mold 110) in the contact process or the separation process. And the imprint system 100 can control (e.g., adjust) the forces that are applied to the mold 110 (e.g., applied to specific regions of the mold 110) in the contact process or the separation process. In some embodiments, the imprint system 100 estimates the forces applied to the mold 110 based on actuator control signals (current, voltage, etc.) of the imprint head 119 that are used to move the template chuck 118 towards the substrate chuck 104.

And the imprint system 100 includes a deformation device 138, which can deform the mold 110 (e.g., a pattern area 113 of the mold 110) of the template 108. The deformation device 138 may deform the mold 110 such that a shape (including a size) of the mold 110 in a plane parallel to the x-y plane is changed. The deformation device 138 may deform the mold 110 by applying forces to at least some of the four side surfaces of the template 108 (or the mold 110), for example. Accordingly, the deformation device 138 is a correction mechanism that physically deforms the mold 110 by applying external forces from the sides of the template 108 and the mold 110. By applying forces to the sides of the template 108, the shape of the pattern area 113 of the mold 110 can be corrected. By making the pattern area 113 a desired shape through this correction, the difference between the shape of the pattern (shot area) formed on the substrate 102 and the shape of the pattern area 113 formed in the mold 110 can be reduced.

Also, the imprint system 100 may include one or more pressure mechanisms that apply forces to a surface of the template 108 on a side opposite to the pattern surface 112 (e.g., apply forces along the direction of the negative z axis in FIG. 1) to deform the pattern surface 112 of the mold 110 such that the pattern surface 112 of the mold 110 becomes convex toward the substrate 102 in the contact process.

The imprint system 100 also includes a substrate-heating subsystem 134 (which is an example of a substrate heating unit). The substrate-heating subsystem 134 deforms an imprint field 141 (e.g., a pattern region or a shot region) on the substrate 102 by heating the substrate 102, and the heating may be performed before any formable material 124 has been deposited on the substrate 102 or before formable material 124 that has been deposited on the substrate 102 is imprinted.

The substrate-heating subsystem 134 includes a heating light source 135, which irradiates the substrate 102 with light to heat the substrate 102; an adjusting unit 136, which adjusts the irradiation amount (irradiation amount distribution) of the light; and a reflecting plate 137, which defines an optical path to guide light from the adjusting unit 136 to the substrate 102. In some embodiments, the substrate-heating subsystem 134 is a heat source which may or may not include the heating light source 135 and is incorporated into the substrate chuck 104.

The heating light source 135 emits light that has a wavelength to which the formable material 124, as an ultraviolet curing resin material, is not photosensitive (not cured), for example, light in a wavelength band of 400 nm to 2,000 nm. For heating efficiency, some embodiments of the heating light source 135 emit light in a wavelength band of 500 nm to 800 nm. However, some embodiments of the heating light source 135 emit light in other wavelength bands. Also, in some embodiments, the heating light source 135 is a laser, such as a high-power laser.

The adjusting unit 136 allows only specific light of the emitted light to irradiate the substrate 102 in order to form a predetermined irradiation-amount distribution on the substrate 102. In some embodiments, the adjusting unit 136 includes one or more spatial light modulators (SLMs). An example of an SLM is a mirror array having an array of a plurality of mirrors, each including a drive axis, which may be referred to as digital mirror device (DMD), such as a digital micro-mirror device. A DMD can control (change) an irradiation amount distribution by individually adjusting the plane direction of each mirror.

Furthermore, the imaging device 131 can detect (capture images of) alignment marks and overlay marks. Substrates 102 and templates 108 may include corresponding pairs of alignment marks that allow real-time alignment of the templates 108 and the substrates 102. After a template 108 is positioned over a substrate 102 (e.g., superimposed over the substrate 102), the lithography-control device 175 determines an alignment of the template-alignment marks with respect to the substrate-alignment marks based on the signals (e.g., images) from the imaging device 131. Alignment schemes may include "through the mask" (TTM) measurement of alignment errors associated with pairs of corresponding alignment marks, followed by compensation of these errors to achieve accurate alignment of the template 108 and a desired imprint location on the substrate 102.

Additionally, substrates 102 and templates 108 may include corresponding pairs of overlay marks that allow for assessment of and compensation for overlay errors in imprinted substrates 102. Overlay marks in a template 108 are transferred to the polymeric layer (e.g., patterned layer 125) during polymerization of the formable material 124, yielding an imprinted substrate 102 with corresponding pairs of overlay marks. The lithography-control device 175 may assess overlay errors of corresponding pairs of overlay marks in an imprinted substrate 102 to determine in-plane and out-of-plane contributions to overlay errors.

And, as noted above, one or both of the substrate positioning stage 107 and the imprint head 119 can be moved (e.g., translated, rotated) to change the relative positions of the substrate 102 and the imprint head 119. Also, the tilt of the template 108 (or, in some embodiments, the tilt of the substrate 102) can be adjusted. For example, the imprint system 100 may include actuators (or other devices) that can translate the template 108 about orthogonal axes (x and y axes in FIG. 1) in the plane of the template 108, rotate the template 108 about an axis orthogonal to the plane (the z axis in FIG. 1), or both. Also for example, some embodiments of the imprint system 100 may translate the template 108 along the z axis and rotate the template 108 about an axis in the plane of the template 108 (x and y axes in FIG. 1).

Figure 5:
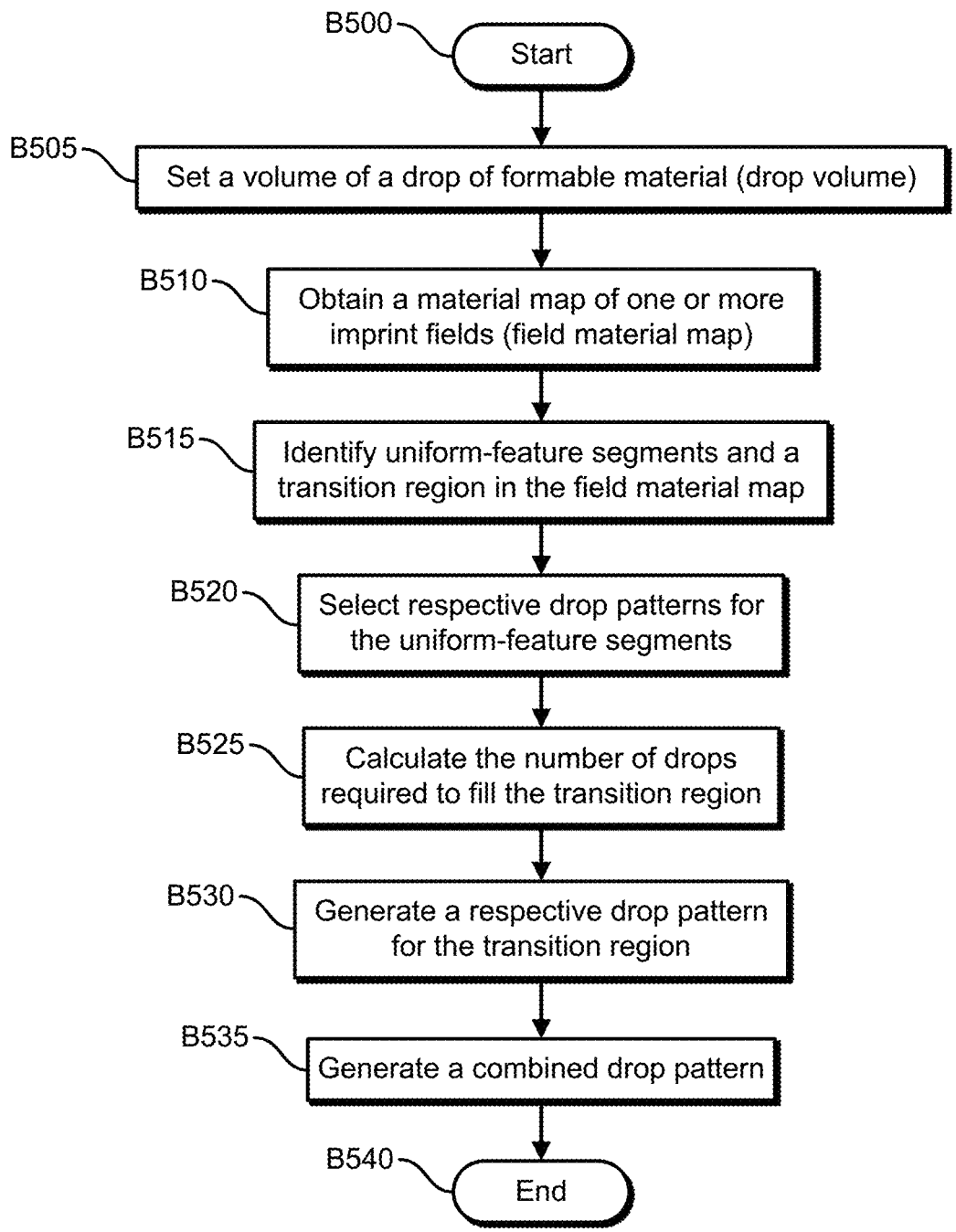
FIG. 5 illustrates an example embodiment of an operational flow for generating a drop pattern.

FIG. 5 illustrates an example embodiment of an operational flow for generating a drop pattern. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

Furthermore, although this operational flow and the other operational flows that are described herein are performed by a drop-pattern-generation device, some embodiments of these operational flows are performed by two or more drop-pattern-generation devices, by one or more lithography-control devices, or by one or more other specially-configured computing devices.

The flow starts in block B500 and then moves to block B505, where a drop-pattern-generation device sets (e.g., obtains, retrieves, receives) a volume of a drop of formable material (a drop volume), which indicates the volume of formable material in a single drop. Depending on the components (e.g., the fluid dispenser) of the corresponding imprint system, the drop volume may have a range of possible volumes (e.g., may be adjustable), or the drop volume may have a fixed volume.

Next, in block B510, the drop-pattern-generation device obtains a material map of one or more imprint fields (a field material map). The field material map may cover an entire substrate, may describe only a single imprint field, or may describe a plurality of imprint fields. And the field material map encodes the field feature density distribution across the imprint field and orientation distribution across the imprint field. For example, a field material map may be an image (e.g., bitmap, PNG) in which the respective value of each tile (e.g., pixel) indicates a volume of imprint material (e.g., a thickness of a patterned layer, such as the patterned layer 125 in FIG. 1).

Figure 14:
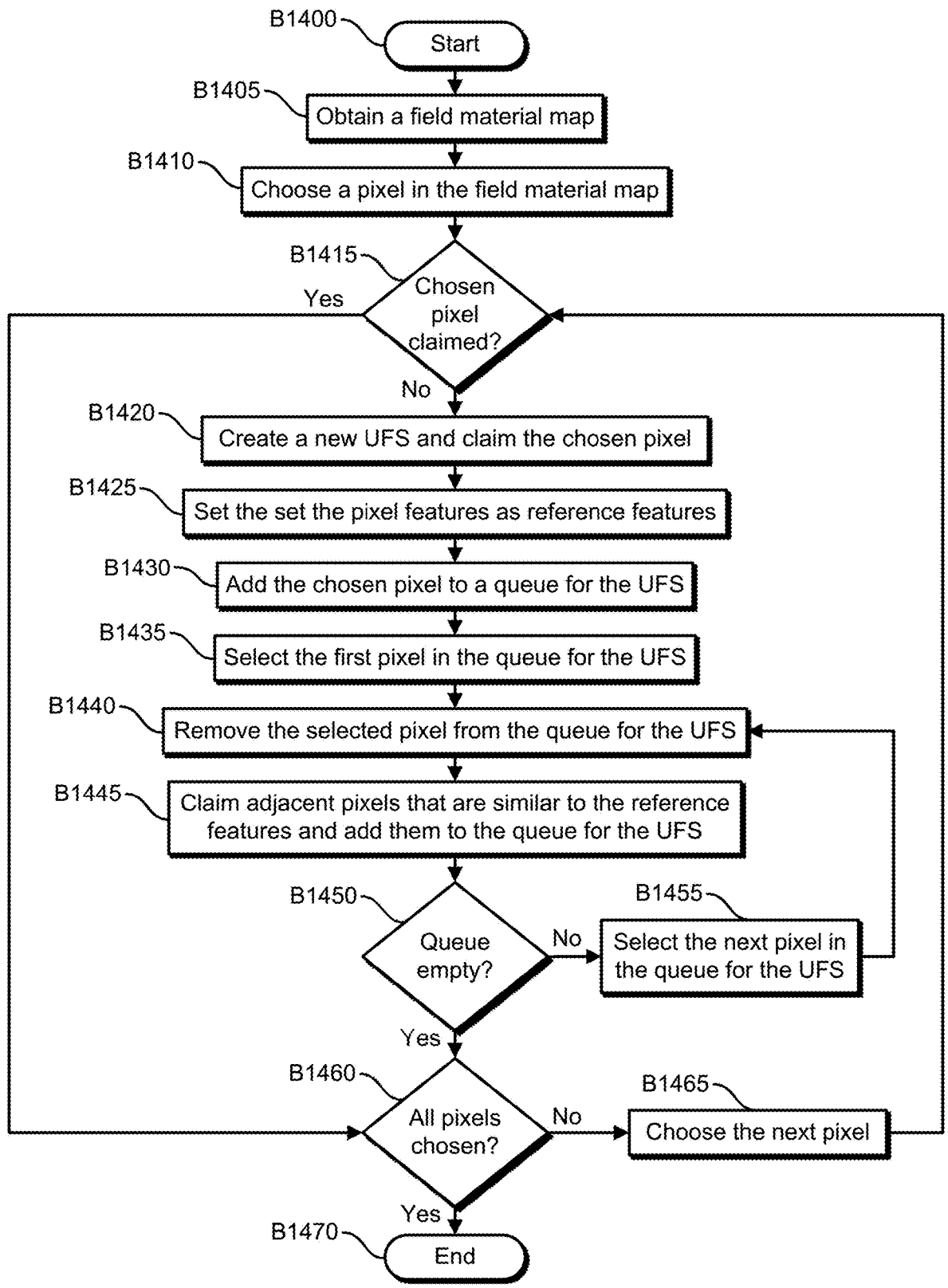
FIG. 14 illustrates an example embodiment of an operational flow for identifying uniform-feature segments.

Next, in block B515, the drop-pattern-generation device identifies uniform-feature segments and a transition region in the field material map (e.g., as described in FIG. 14). As noted above, uniform-feature segments are segments that have uniform features of the same feature density and orientation, and the transition region is an area between the uniform-feature segments that lacks uniform features and that may contain other non-repeating features.

Figure 6:
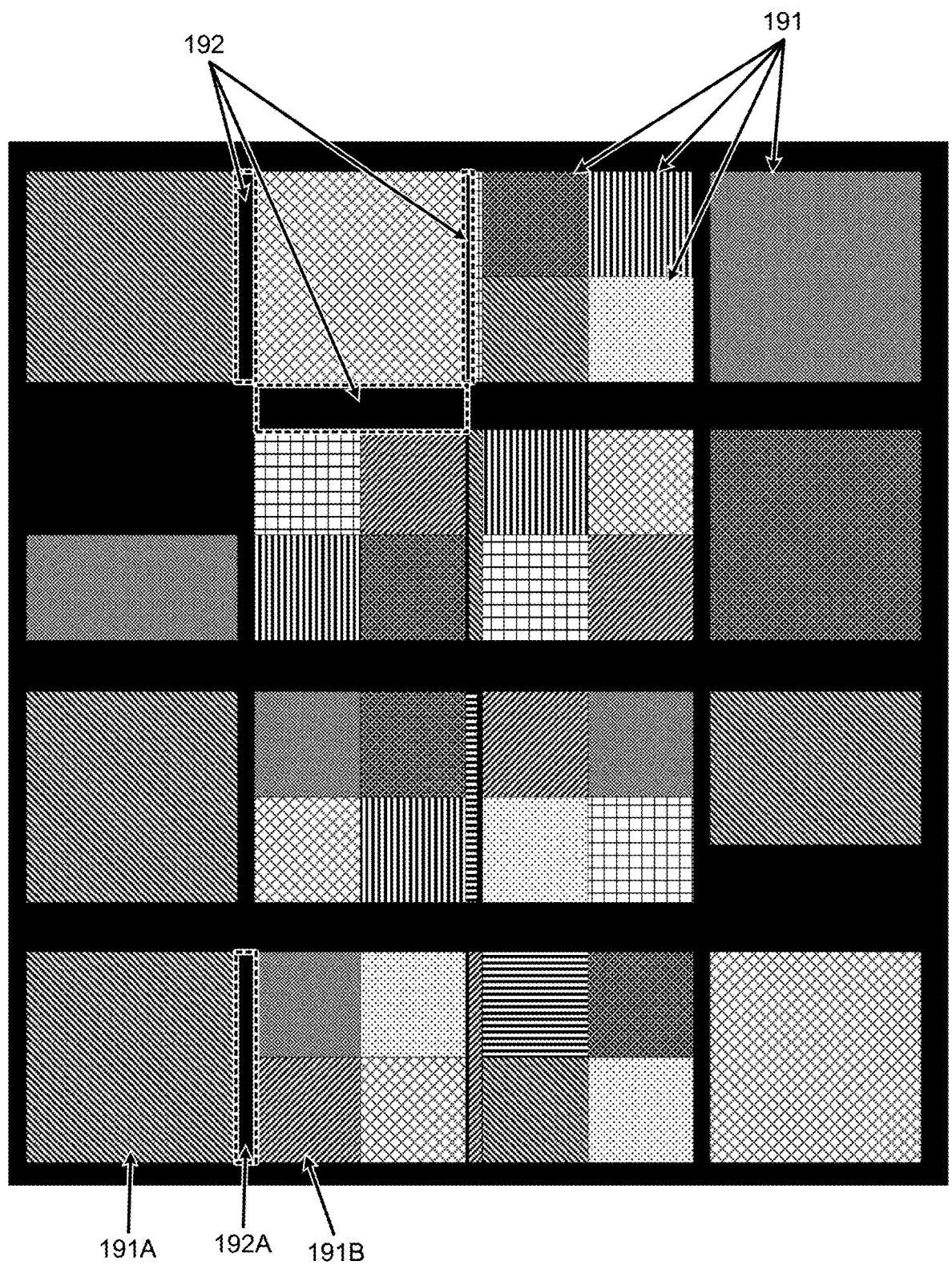
FIG. 6 illustrates an example embodiment of uniform-feature segments and transition regions in a field material map.

For example, FIG. 6 illustrates an example embodiment of uniform-feature segments 191 and transition regions 192 that have been identified in a field material map. The uniform-feature segments 191 are indicated by respective patterns, and the transition regions 192, some of which are indicated by rectangles that are formed from dashed lines, are the black regions between the uniform-feature segments 191. Also, the uniform-feature segments 191 and the transition regions 192 are shown in the same locations that they have in the field material map.

Figure 15:
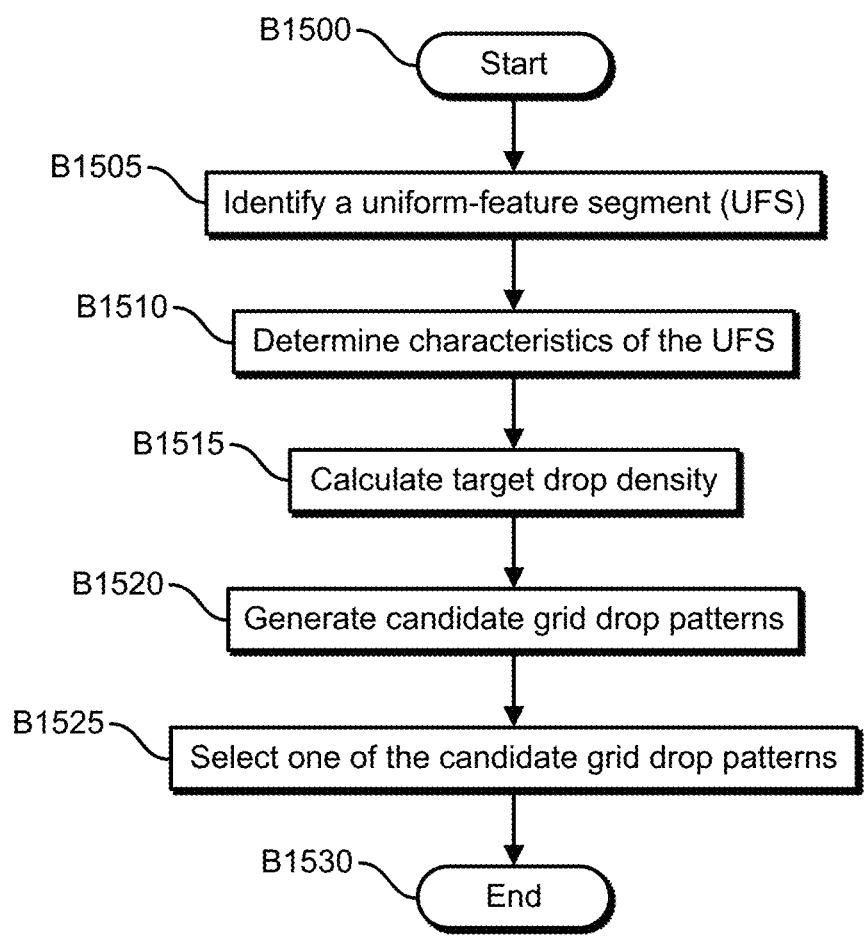
FIG. 15 illustrates an example embodiment of an operational flow for generating a grid drop pattern for a uniform-feature segment.

The flow then moves to block B520, where the drop-pattern-generation device selects (or generates) respective drop patterns for the uniform-feature segments (e.g., as described in FIG. 15). The selection or generation of a drop pattern may be based on the feature density and/or the dominant feature orientation of the features in the respective uniform-feature segment.

Then, in block B525, the drop-pattern-generation device calculates the number of drops that are required to fill the transition region. The calculation is based on the drop volume and on the amount of formable material that is required to fill the transition region. The flow then proceeds to block B530, where the drop-pattern-generation device generates a respective drop pattern for the transition region. For example, the respective drop pattern for the transition region may minimize a metric that is a weighted sum of inverse distances between drops in the transition region and drops in the uniform-feature segments that are adjacent to the transition region.

Next, in block B535, the drop-pattern-generation device generates a combined drop pattern, which combines the respective drop patterns for the uniform-feature segments and the respective drop pattern for the transition region.

Finally, the flow ends in block B540. Also, after block B535, the drop-pattern-generation device may supply the combined drop pattern to an imprint system, which may deposit drops of formable material onto a substrate in accordance with the combined drop pattern.

Figure 7:
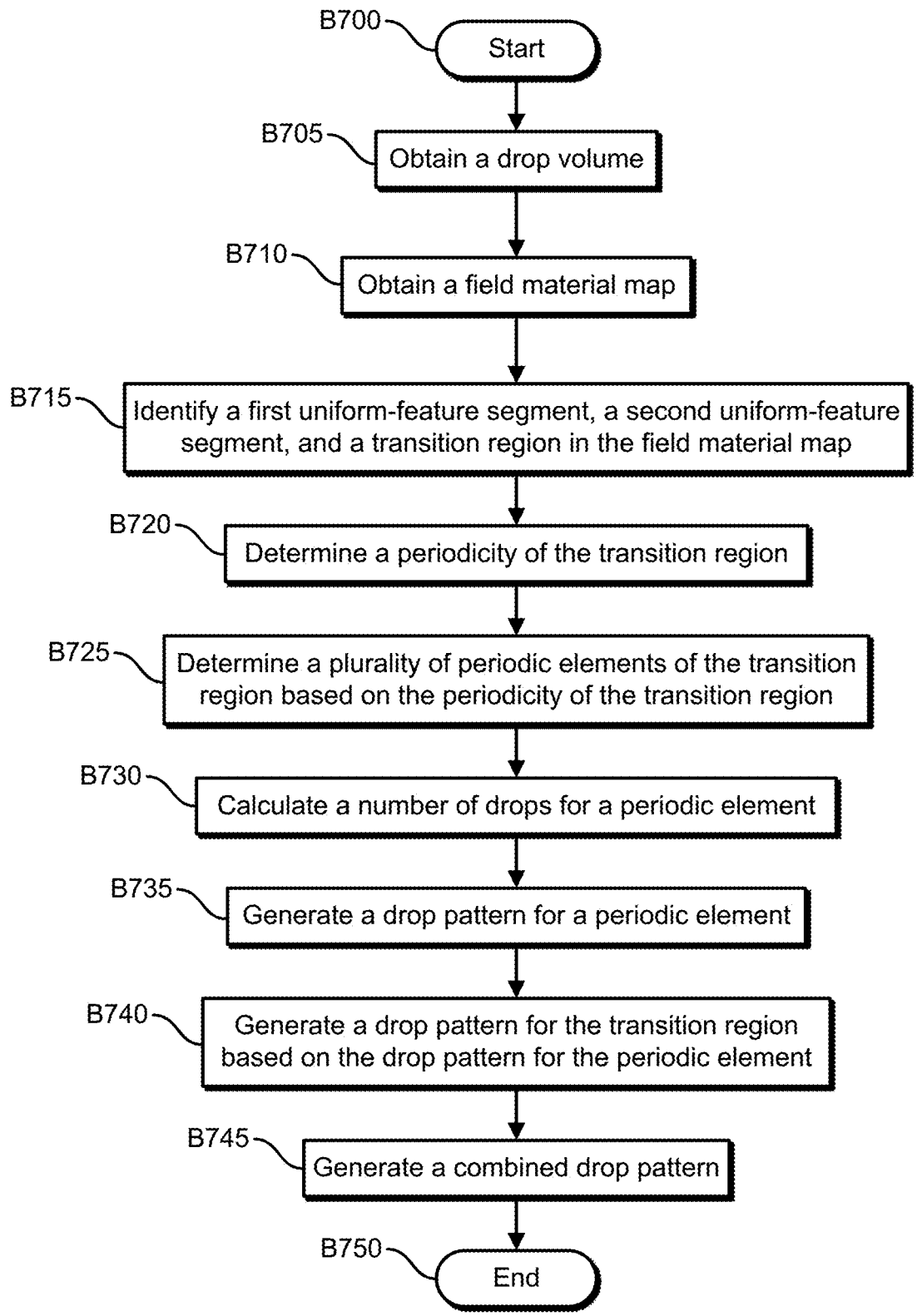
FIG. 7 illustrates an example embodiment of an operational flow for generating a drop pattern.

FIG. 7 illustrates an example embodiment of an operational flow for generating a drop pattern. The flow starts in block B700 and then moves to block B705, where a drop-pattern-generation device obtains a drop volume. Next, in block B710, the drop-pattern-generation device obtains a field material map.

The flow then advances to block B715, where the drop-pattern-generation device identifies a first uniform-feature segment, a second uniform-feature segment, and a transition region in the field material map. The transition region is located between the first uniform-feature segment and the second uniform-feature segment. For example, in FIG. 6, a first transition region 192A is located between (e.g., sandwiched between) a first uniform-feature segment 191A and a second uniform-feature segment 191B.

Then the flow proceeds to block B720, where the drop-pattern-generation device determines the periodicity of the transition region. The periodicity is the distance along the transition region (e.g., the distance in terms of the number of drop-dispense spacings) in which the drop arrangement of the drop patterns (e.g., the grid drop patterns) of the uniform-feature segments flanking the transition region does not repeat.

Some grid drop patterns are characterized by two different orthogonal periodicities that are multiples of properties of the fluid dispenser, such as nozzle pitch for one direction and clock rate for the scanning direction (the scanning direction is typically orthogonal to the nozzle pitch but not always). The periodicity that is determined in block B720 is the periodicity that is parallel to the transition region. Although the examples in this description have rectangular uniform segments with edges that are parallel to these two periodicities, some embodiments are not limited to such, although the periodicities of these other embodiments are parallel to the transition region.

For any two arbitrary grid drop patterns placed adjacent to each other along their horizontal or vertical sides, the local drop arrangement is repeated every certain number of dispense locations. This number can be the periodicity, and this number is equal to the least common multiple of the stride lengths of the two flanking grid drop patterns (e.g., for two grid drop patterns with stride lengths of 6 and 4 dispense spacings along the transition region's direction, the periodicity is 12).

Figure 8A:
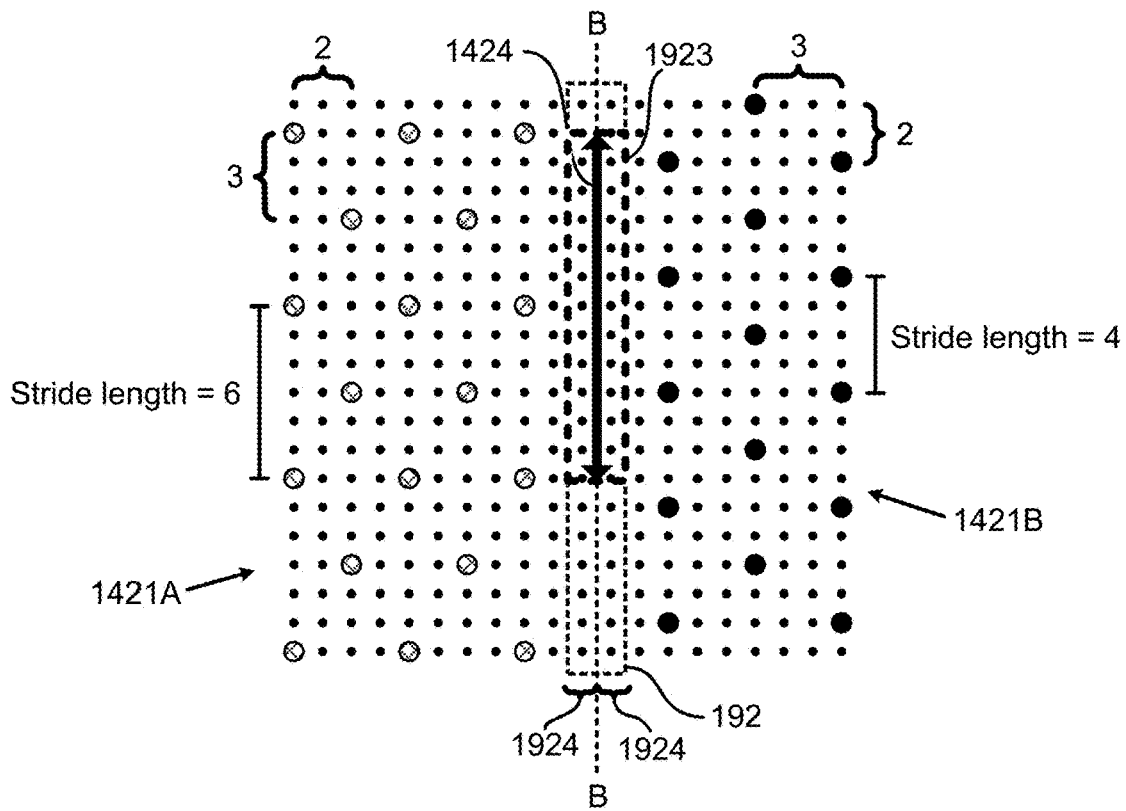
FIG. 8A illustrates an example embodiment of a periodicity of a transition region.

For example, FIG. 8A illustrates an example embodiment of a periodicity of a transition region 192. In FIG. 8A, the grid drop pattern 1421A on the left is the drop pattern of a first uniform-feature segment, and the grid drop pattern 1421B on the right is the drop pattern of a second uniform-feature segment. The drop locations of the grid drop pattern 1421A on the left are indicated by the patterned circles, and the drop locations of the grid drop pattern 1421B on the right are indicated by the black circles. The small black dots indicate dispense spacings. The grid drop pattern 1421A on the left is a 2×3 grid (2 dispense spacings by 3 dispense spacings), and the grid drop pattern 1421B on the right is a 3×2 grid (3 dispense spacings by 2 dispense spacings). Also, along the direction of the transition region 192, the stride length of the grid drop pattern 1421A on the left is 6, and the stride length of the grid drop pattern 1421B on the right is 4. Thus, the periodicity 1424 (the least common multiple) of the transition region 192 is 12.

Figure 8B:
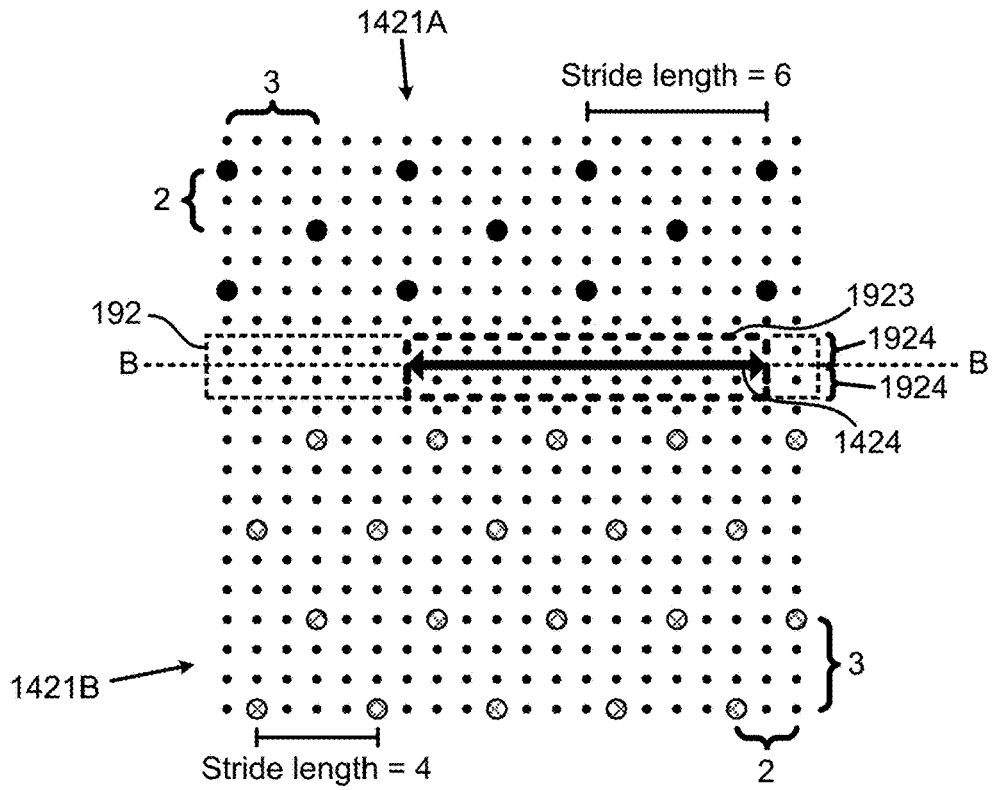
FIG. 8B illustrates an example embodiment of a periodicity of a transition region.

Also for example, FIG. 8B illustrates an example embodiment of a periodicity of a transition region. In FIG. 8A, the grid drop pattern 1421A on the top is the drop pattern of a first uniform-feature segment, and the grid drop pattern 1421B on the bottom is the drop pattern of a second uniform-feature segment. The drop locations of the grid drop pattern 1421A on the top are indicated by the black circles, and the drop locations of the grid drop pattern 1421B on the bottom are indicated by the patterned circles. The small black dots indicate dispense spacings. The grid drop pattern 1421A on the top is a 3×2 grid, and the grid drop pattern 1421B on the bottom is a 2×3 grid. Also, along the direction of the transition region 192, the stride length of the grid drop pattern 1421A on the top is 6, and the stride length of the grid drop pattern 1421B on the bottom is 4. Thus, the periodicity 1424 of the transition region 192 is 12.

Next, in block B725, the drop-pattern-generation device determines a plurality of periodic elements of the transition region based on the periodicity of the transition region. For example, a periodic element of the transition may have a length that is equal to the periodicity. FIGS. 8A and 8B illustrate examples of periodic elements 1923, and these periodic elements are equal to the lengths of the periodicities.

Also, if the transition region does not have a length that is equal to an integer multiple of the periodicity, then one or both of the periodic elements on the ends may be truncated. Because the periodic elements are identical or simply truncated, the drop-pattern-generation device can calculate only the drop pattern for a single periodic element and then reuse that drop pattern for all of the other periodic elements (truncating the drop pattern when appropriate). This reduces the computational expense of determining the drop pattern for the transition region.

Furthermore, the width of a periodic element (or of the transition region more generally) may be based on a segment-edge-exclusion distance, in which the grid drop patterns of the uniform-feature segments are terminated and no drops for the grid drop patterns are added. The segment-edge-exclusion distance may be input by a user or calculated by the drop-pattern-generation device. For example, each boundary line between two uniform-feature segments may be flanked by two segment-edge-exclusion regions that do not include any drops from the grid drop patterns of the uniform-feature segments. These two segment-edge-exclusion regions and the boundary line may constitute the transition region. For example, in FIGS. 8A, the boundary BB between the two grid drop patterns 1421 is flanked on each side by a segment-edge-exclusion region 1924. Another example is illustrated in FIG. 8B.

In some embodiments, such as the embodiments in FIGS. 8A and 8B, the width of each segment-edge-exclusion region 1924 is not less than one dispense-grid spacing, for a total transition-region width of at least two dispense-grid spacings. While there is no upper bound for the width of the segment-edge-exclusion region 1924, a large width of the segment-edge-exclusion region 1924 may reduce the filling quality in regions far away from the transition region 192 and may increases the computational complexity of transition-region drop-arrangement optimization (described below). Thus, it may be advantageous for the width of the segment-edge-exclusion regions 1924 to not exceed twice the stride of any of the grid drop patterns 1421 that flank the transition region. In some embodiments, the width of each segment-edge-exclusion region 1924 is one to four grid spacings, for a total transition-region width of two to eight dispense-grid spacings.

The flow then moves to block B730, where the drop-pattern-generation device calculates a number of drops for a periodic element. For example, calculating the number of drops for a periodic element (or an integer multiple of the periodic element) may include the following: calculating the residual-layer thickness of the entire transition region (or just the periodic element), calculating the total fluid volume required to fill the residual-layer thickness of the entire transition region (or just the periodic element), and calculating the number of drops required to provide the total fluid volume. In some embodiments, the number of drops may be for an integer multiple of the periodic element. The integer multiple of the periodic element may be chosen to bring the number of required drops as close as possible to an integer quantity. For example, if 0.4 drops are required for 1 period, the drop-pattern-generation device generates 2 drops for 5 periods (2/5=0.4). The number 5 is chosen because it is the smallest integer that brings 0.4 (as in 0.4*5) as close to an integer (2 in this case) as possible. If the calculated number of drops is the total for the entire transition region, the calculated number is divided by the ratio of the area of the periodic element to the total area of the transition region.

The flow then proceeds to block B735, where the drop-pattern-generation device generates a drop pattern for a periodic element. For example, the respective drop pattern for the periodic element of the transition region may minimize a metric that is a weighted sum of inverse distances between drops in the periodic element and drops in the uniform-feature segments that are adjacent to the periodic element. For example, some embodiments of the respective drop pattern for the periodic element minimize a metric that is a weighted sum of inverse distances (i) between drops in the selected one or more periodic elements and the other drops in the selected one or more periodic elements and (ii) between drop in the selected one or more periodic elements and drops in the uniform-feature segments that are adjacent to the selected one or more periodic elements.

Next, in block B740, the drop-pattern-generation device generates a drop pattern for the transition region based on the drop pattern for the periodic element. For example, the drop pattern for the transition region may include multiple copies of the drop pattern for the periodic element (one copy of the drop pattern for each instance of the periodic element) that have been appended together. Also, the copy of the drop pattern for the periodic element may be truncated when the corresponding instance of the periodic element is truncated.

Figure 9:
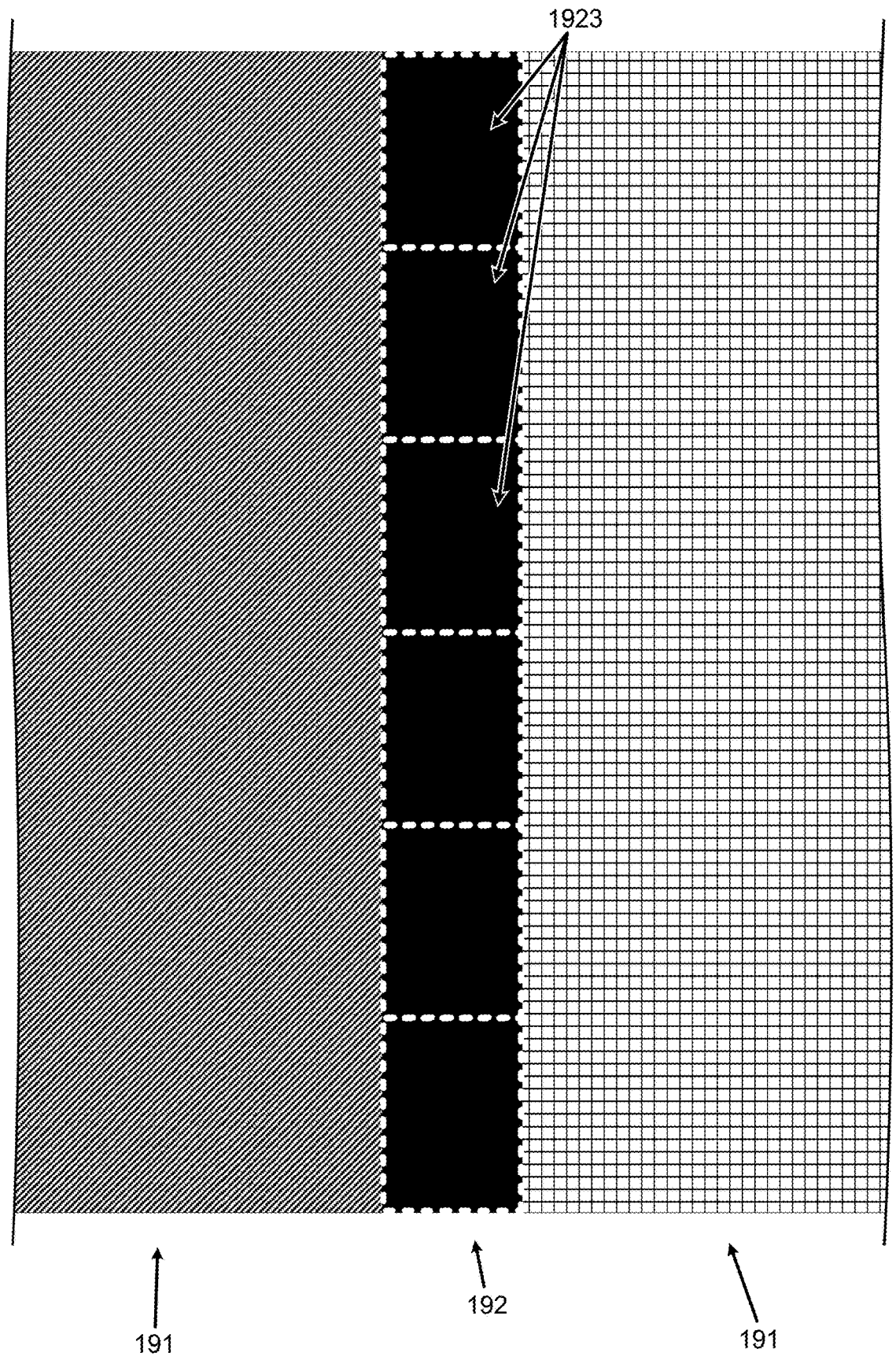
FIG. 9 illustrates an example embodiment of periodic elements in a transition region.

For example, FIG. 9 illustrates an example embodiment of periodic elements in a transition region. The transition region 192 is shown in black and is flanked (abutted) by two uniform-feature segments 191. The transition region 192 includes six periodic elements 1923. To reduce the computational expense for generating a drop pattern for the entire transition region 192, the drop-pattern-generation device can perform a generation process to generate a drop pattern for only one of the six periodic elements 1923 and then join six copies of the drop pattern for the periodic element. The six copies have an arrangement that corresponds to the arrangement of the six periodic elements 1923.

Then, in block B745, the drop-pattern-generation device generates a combined drop pattern, which combines the respective drop patterns for the uniform-feature segments and the respective drop pattern for the transition region. Finally, the flow ends in block B750. Also, after block B745, the drop-pattern-generation device may supply the combined drop pattern to an imprint system, which may deposit drops of formable material onto a substrate in accordance with the combined drop pattern.

Figure 10:
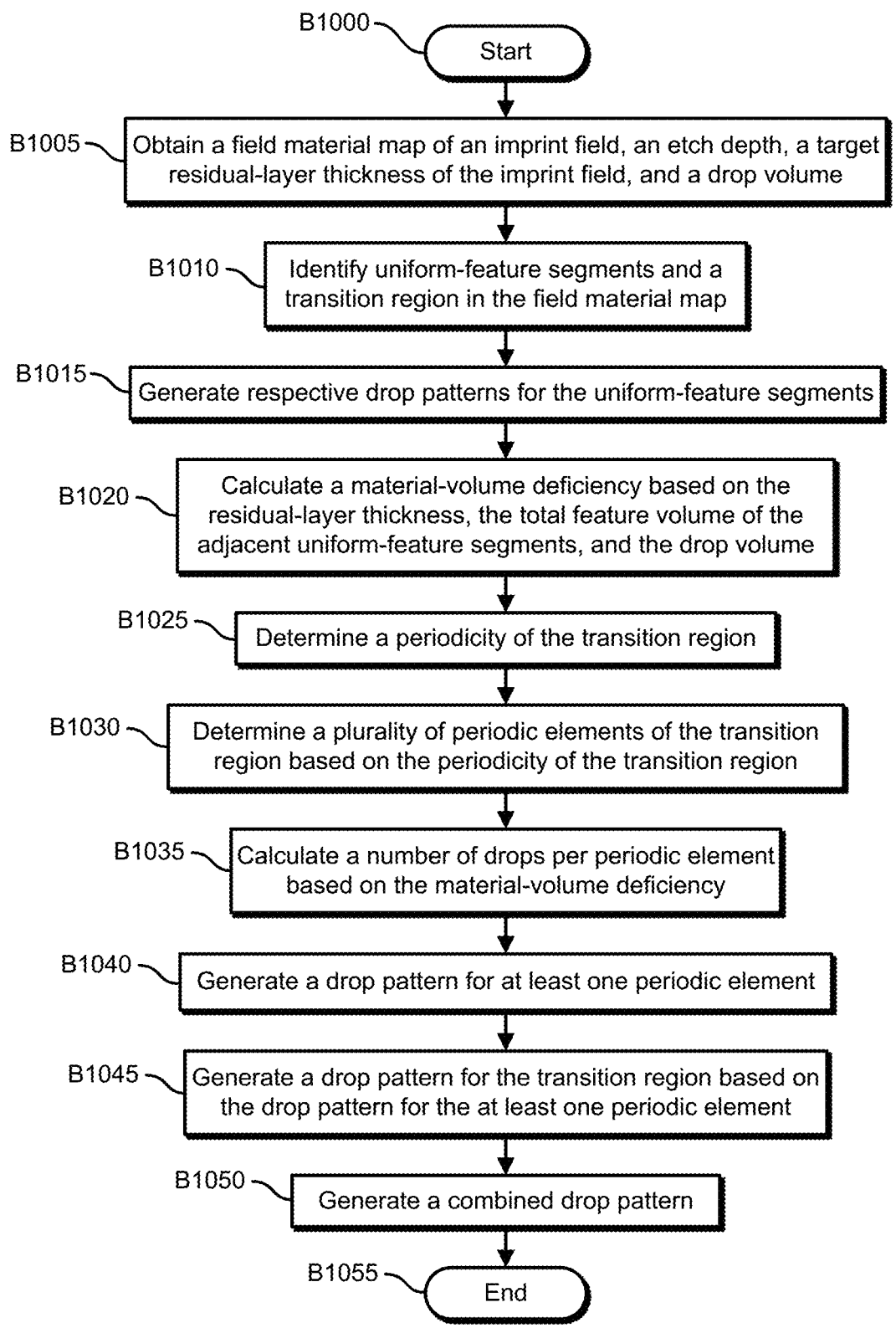
FIG. 10 illustrates an example embodiment of an operational flow for generating a drop pattern.

FIG. 10 illustrates an example embodiment of an operational flow for generating a drop pattern. The flow starts in block B1000 and then moves to block B1005, where a drop-pattern-generation device obtains a field material map of an imprint field, an etch depth of the imprint field, a target residual-layer thickness (or, in some embodiments, a target top-layer thickness) of the imprint field, and a drop volume.

The flow then advances to block B1010, where the drop-pattern-generation device identifies uniform-feature segments and a transition region in the field material map. The transition region is located between the uniform-feature segments. The flow then moves to block B1015, where the drop-pattern-generation device generates respective drop patterns for the uniform-feature segments.

Next, in block B1020, the drop-pattern-generation device calculates a material-volume deficiency based on the residual-layer thickness, the total feature volume of the adjacent uniform-feature segments, and the drop volume. The material-volume deficiency indicates the volume of formal material that should be added to the transition region to bring the residual-layer thickness (or top-layer thickness) of the transition region to the target residual-layer thickness (or target top-layer thickness) of the imprint field. Additionally, the total feature volume of the adjacent uniform-feature segments is based on the etch depth and on the field material map. In some embodiments, the field material map includes multiple different etch depths.

Then the flow proceeds to block B1025, where the drop-pattern-generation device determines a periodicity of the transition region. Next, in block B1030, the drop-pattern-generation device determines a plurality of periodic elements of the transition region based on the periodicity of the transition region.

The flow then advances to block B1035, where the drop-pattern-generation device calculates a number of drops (e.g., a drop density) per periodic element based on the material-volume deficiency. For example, the number of drops per periodic element may have an aggregate formable-material volume that is equal to, or approximately equal to, the material-volume deficiency of the periodic element.

Next, in block B1040, the drop-pattern-generation device generates a drop pattern for at least one periodic element. For example, the drop-pattern-generation device may generate a drop pattern for only one periodic element. Or the drop-pattern-generation device may jointly generate a drop pattern for multiple periodic elements. If the number of drops per periodic element is not equal to (or within a specified range of) an integer, the drop-pattern-generation device may select a number of periodic elements that, in the aggregate, have a number of drops that is equal to (or within a specified range of) an integer. For example, if the number of drops per periodic element is 2.5, then the drop-pattern-generation device may select two periodic elements because the number of drops per the two periodic elements is 5.

The flow then advances to block B1045, where the drop-pattern-generation device generates a drop pattern for the transition region based on the drop pattern for the at least one periodic element. Then, in block B1050, the drop-pattern-generation device generates a combined drop pattern, which combines the respective drop patterns for the uniform-feature segments and the drop pattern for the transition region. Finally, the flow ends in block B1055. Also, after block B1050, the drop-pattern-generation device may supply the combined drop pattern to an imprint system, which may deposit drops of formable material onto a substrate in accordance with the combined drop pattern.

Figure 11:
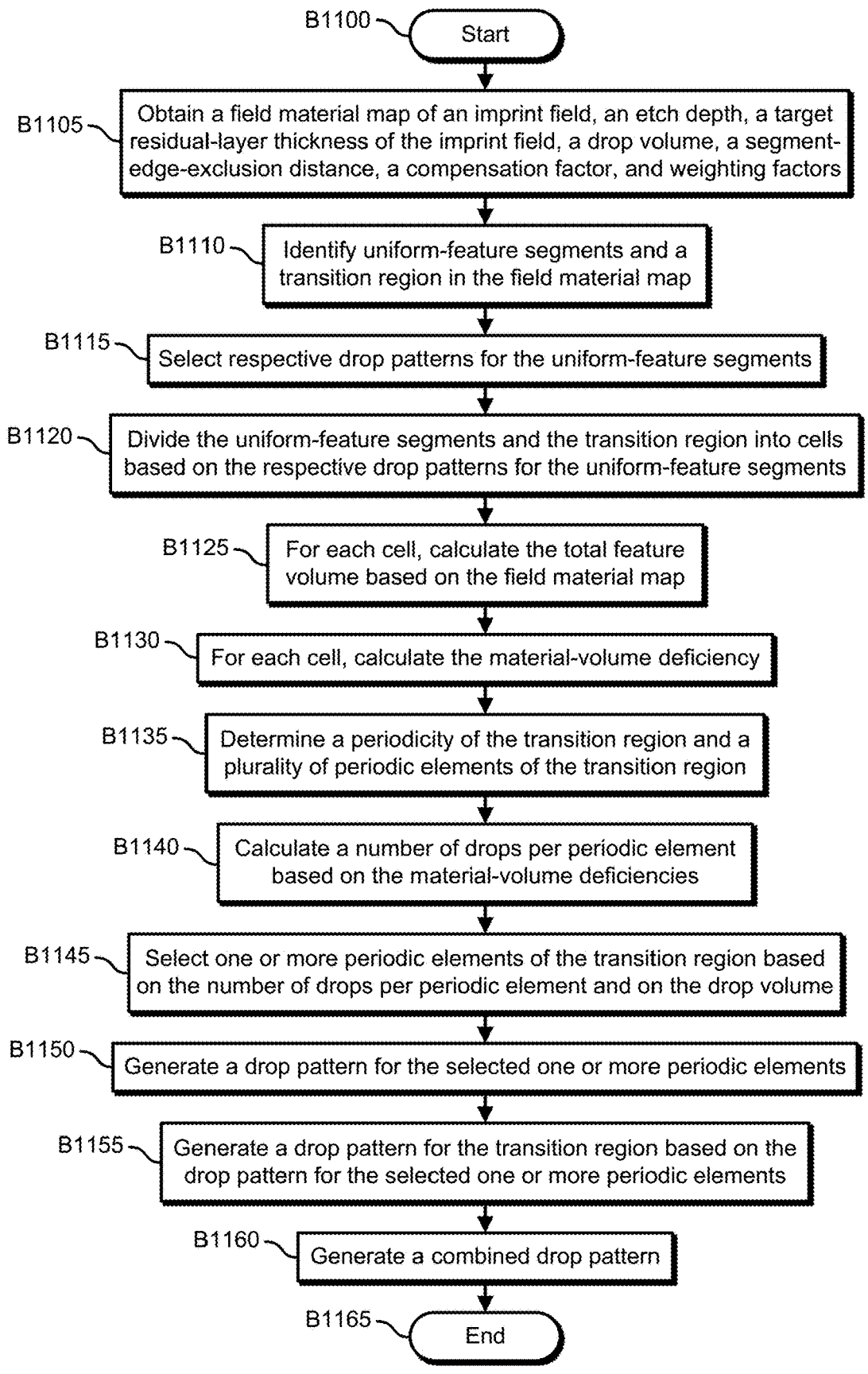
FIG. 11 illustrates an example embodiment of an operational flow for generating a drop pattern.

FIG. 11 illustrates an example embodiment of an operational flow for generating a drop pattern. The flow starts in block B1100 and then moves to block B1105, where a drop-pattern-generation device obtains a field material map of an imprint field, an etch depth of the imprint field, a target residual-layer thickness (or target top-layer thickness) for the imprint field, a drop volume, a segment-edge-exclusion distance, a compensation factor, and weighting factors.

The flow then advances to block B1110, where the drop-pattern-generation device identifies uniform-feature segments and a transition region in the field material map. The transition region is located between the uniform-feature segments and is identified based on the segment-edge-exclusion distance. The flow then moves to block B1115, where the drop-pattern-generation device selects (or generates) respective drop patterns for the uniform-feature segments.

Figure 12:
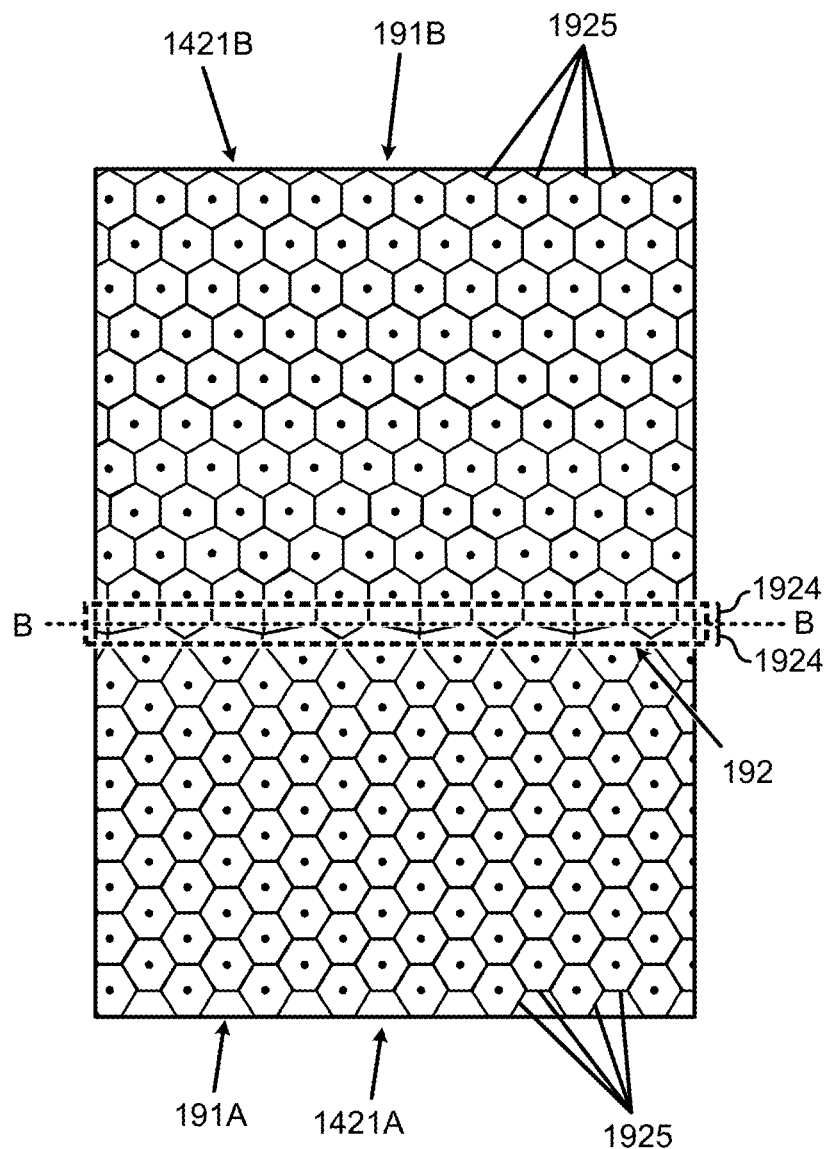
FIG. 12 illustrates an example embodiment of uniform-feature segments and a transition region that have been divided into Voronoi cells.

Next, in block B1120, the drop-pattern-generation device divides the uniform-feature segments and the transition region into cells based on the respective drop patterns for the uniform-feature segments. For example, the drop-pattern-generation device may divide the uniform-feature segments and the transition region into Voronoi cells in which each drop of the respective drop patterns for the uniform-feature segments is a centroid of a Voronoi cell. FIG. 12 illustrates an example embodiment of uniform-feature segments and a transition region that have been divided into Voronoi cells. Also, in FIG. 12, the respective drop patterns have been overlaid on the uniform-feature segments. A first grid drop pattern 1421A has been overlaid over a first uniform-feature segment 191A, and a second grid drop pattern 1421B has been overlaid over a second uniform-feature segment 191B. Each of the drops in the drop patterns 1421 is the centroid of a respective Voronoi cell 1925. Also, some of the Voronoi cells 1925 include parts of the transition region 192, which includes two segment-edge-exclusion regions 1924 that abut a border BB between the uniform-feature segments 191.

The flow then moves to block B1125 where, for each cell, the drop-pattern-generation device calculates the total feature volume, which is the total volume of formable material that is required to fill the features in the area that corresponds to the cell in the field material map. The calculation of the total feature volume is based on the field material map and on the etch depth.

Then, in block B1130, the drop-pattern-generation device calculates the material-volume deficiency for each cell. A cell's material-volume deficiency may be calculated by the following: First, the drop-pattern-generation device may subtract the cell's total feature volume from the drop volume. Second, the drop-pattern-generation device may divide the difference by the area of the cell, which produces a baseline residual-layer thickness for the cell. Third, the baseline residual-layer thickness for the cell is subtracted from the target residual-layer thickness, which produces the residual-layer difference. And fourth, the residual-layer difference is multiplied by the area of the cell. Thus, in some embodiments, a cell's material-volume deficiency may be described by the following:

$$CVol_{deficiency} = \left(RLT_{target} - \frac{(Vol_{drop} - Vol_{Cell\_tot\_feature})}{Area_{cell}}\right) \times Area_{cell}, \quad (1)$$

where $CVol_{deficiency}$ is the cell's material-volume deficiency, where $Vol_{drop}$ is the drop volume, where $Vol_{cell\_tot\_feature}$ is the cell's total feature volume, where $Area_{cell}$ is the area of the cell, and where $RLT_{target}$ is the target residual-layer thickness. In an alternative embodiment, the $RLT_{target}$ is replaced with $TLT_{target}$, which is the target top-layer thickness.

Next, in block B1135, the drop-pattern-generation device determines a periodicity of the transition region and a plurality of periodic elements of the transition region.

The flow then proceeds to block B1140, where the drop-pattern-generation device calculates a number of drops per periodic element based on the material-volume deficiencies of the cells that respectively include a part of the transition region. For example, the drop-pattern-generation device may calculate the sum of all of the material-volume deficiencies of the cells that respectively include a part of the transition region, divide the sum by the number of periodic elements to obtain the material-volume deficiency of each periodic element, and then divide the material-volume deficiency of each periodic element by the drop volume. Also for example, in some embodiments the calculation of a number of drops per periodic element may be described by the following:

$$Drop_{pe} = \frac{Sum\_CVol_{deficiency} \times \left(\frac{length_{pe}}{length_{tr}}\right)}{Vol_{drop}}, \quad (2)$$

where $Drop_{pe}$ is the number of drops per periodic element, where $Sum\_CVol_{deficiency}$ is the sum of the material-volume deficiencies of all of the cells, where $length_{pe}$ is the length of a periodic element, where $length_{tr}$ is the length of the transition region, and where $Vol_{drop}$ is the drop volume. Thus, the number of drops per periodic element may be a drop density per periodic element.

Furthermore, in some embodiments, the number of drops per periodic element (e.g., the drop density per periodic element) may be adjusted by the compensation factor, which was obtained in block B1105 and which may allow for finer control of the drop-pattern generation. For example, the number of drops may be multiplied by the compensation factor (e.g., 0.5-1.0). The compensation factor may be based on experimentally measured defects or on the residual-layer thickness (or top-layer thickness).

Then the flow moves to block B1145, where the drop-pattern-generation device selects one or more periodic elements of the transition region based on the number of drops per periodic element and on the drop volume. For example, the drop-pattern-generation device may multiply the number of drops per periodic element by integers k=1, 2, 3, . . . until the product is closest to an integer m and then select k periodic elements. This prevents a number of drops that includes a fraction of a drop from being used in the following blocks.

The flow then proceeds to block B1150, where the drop-pattern-generation device generates a drop pattern for the selected one or more periodic elements. For example, the drop-pattern-generation device may generate, as candidate drop patterns, all possible drop patterns (all possible combinations of drops for all of the dispense locations) in the selected one or more periodic elements and then select the candidate drop pattern that minimizes a metric that is a weighted sum of inverse distances (i) between drops in the selected one or more periodic elements and the other drops in the selected one or more periodic elements and (ii) between drop in the selected one or more periodic elements and drops in the uniform-feature segments that are adjacent to the selected one or more periodic elements. Because the number of possible combinations can be enormous, at least some of the generated candidate drop patterns may not be stored to avoid storage or memory limitations. Also, each candidate drop pattern may generated from the preceding candidate drop pattern by performing permutations over the dispense locations. And the total number of generated candidate drop patterns can be controlled by changing the maximum number of periodic elements that can be selected in block B1145 (e.g., changing the maximum possible value of k).

For example, each candidate drop pattern may place m drops in k periodic elements, and each periodic element may have PW dispense locations. To generate the candidate drop patterns for the selected one or more periodic elements, the drop-pattern-generation device may generate all combinations of m drops in kPW dispense locations (each combination is a candidate drop pattern).

Also, the metric that is a weighted sum of inverse distances between drops may be a combination energy. The combination energy is a metric that measures the degree of proximity of the drops to each other and to the drops in the flanking grid drop patterns and that is inversely proportional to inter-drop distance. For more uniform fluid spreading and to achieve the target residual-layer thickness, it may be preferable to maximize the distance between the drops in the drop pattern. This is a multi-objective integer optimization problem because moving one drop location in any direction changes the distribution of distances between the drop and all of its neighbors. And to select a drop pattern from the candidate drop patterns, the drop-pattern-generation device may calculate the respective combination energy of each of the candidate drop patterns and then select the candidate drop pattern that has the lowest combination energy.

For example, in some embodiments, the energy E(D) of a drop D can be described by the following:

$$E(D) = A \times S_1(D) + B \times S_2(D), \quad (3)$$

where A and B are weighting factors (e.g., obtained in block B1105); where $S_1(D)$ is sum of the reciprocal of the Euclidean planar distances between each drop and all the other drops, divided by two to avoid double counting; and where $S_2(D)$ is the sum of the reciprocal of the Euclidean planar distances between the drop D and the drops in the grid drop patterns that are within a threshold distance of the transition region. For example, the threshold distance may be the drops in a grid drop pattern that are in a strip that has a width of one periodic element and that has a length that is at least 20 times the thickness of the transition region. The threshold distance may act as an energy-cutoff distance.

Also, for a candidate drop pattern Q, its energy E(Q) is the sum of the respective energy E(D) of each drop D. And, in some embodiments, the respective energy E(D) of a drop D can be described by the following:

$$E(Q) = \frac{A}{2} \sum_{i \, in \, Q} S_1(D_i) + B \sum_{i \, in \, Q} S_2(D_i), \quad (4)$$

-continued $$\text{where } S_1(D_i) = \sum_{\substack{j \in Q \\ j \neq i}} \frac{1}{r(D_i, D_j)},$$

$$\text{where } S_2(D_i) = \sum_{j \in GDP} \frac{1}{r(D_i, D_j)},$$

where $r(D_i, D_j)$ is the distance between drops $D_i$ and $D_j$, and where r is a function that estimates a Euclidean planar distance between two drops $D_i$ and $D_j$.

Figure 13A:
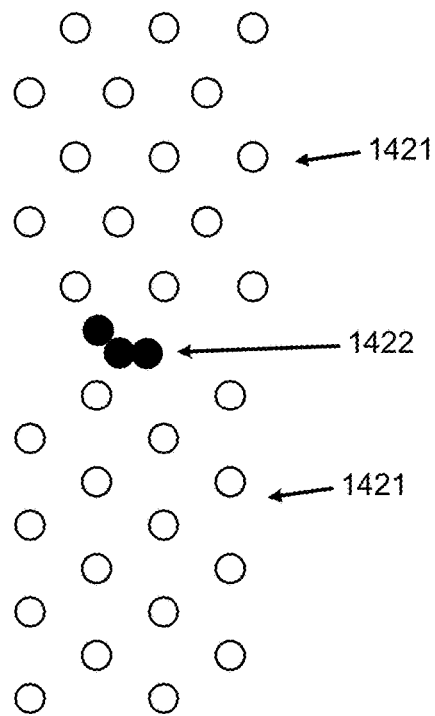
FIGS. 13A-C illustrate example embodiments of grid drop patterns and transition-region drop patterns.
Figure 13B:
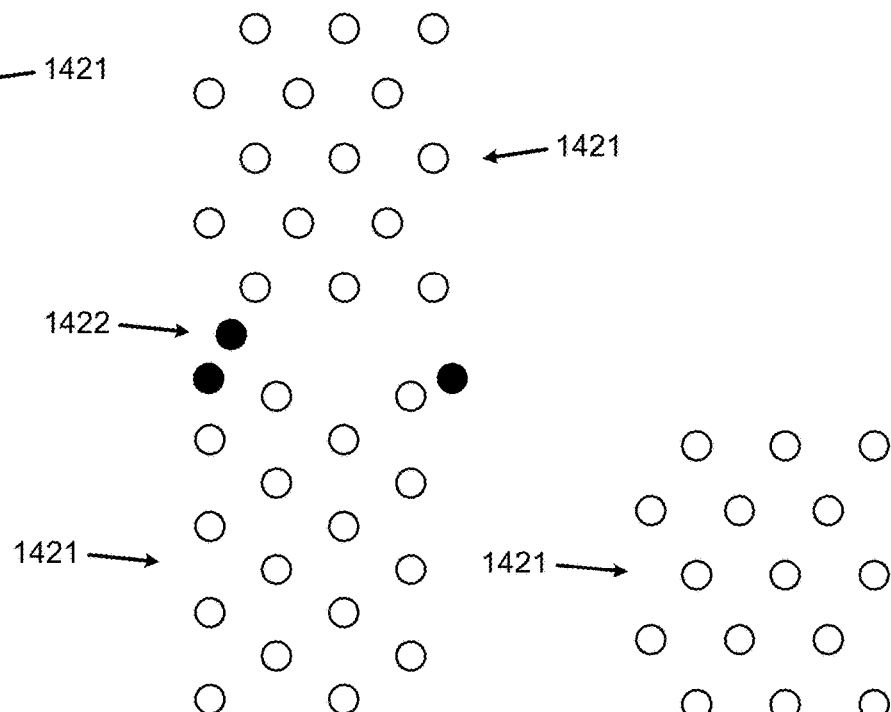
Figure 13C:
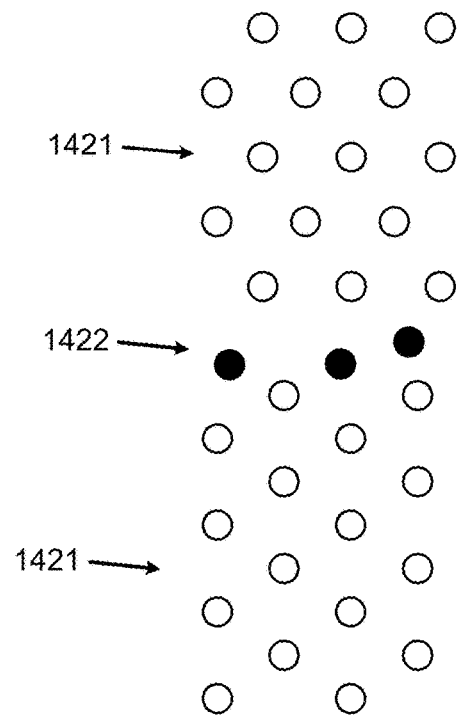

For example, FIGS. 13A-C illustrate example embodiments of grid drop patterns and transition-region drop patterns. In FIGS. 13A-C, the drops in the grid drop patterns 1421 are shown in white, and the drops in the transition-region drop patterns 1422 are shown in black. In FIG. 13A, the transition-region drop pattern 1422 has a high energy and leaves large open areas. In FIG. 13B, the transition-region drop pattern 1422 has a lower energy, but still includes a large gap that needs more time to fill. In FIG. 13C, the transition-region drop pattern 1422 has the lowest energy and achieves the fastest spreading of the drops.

Next, in block B1155, the drop-pattern-generation device generates a drop pattern for the transition region based on the drop pattern for the one or more selected periodic elements. The drop-pattern-generation device may generate the drop pattern for the transition region by repeating the drop pattern for the one or more selected periodic elements along the entire length of the transition region.

The flow then moves to block B1160, where the drop-pattern-generation device generates a combined drop pattern, which combines the respective grid drop patterns for the uniform-feature segments and the drop pattern for the transition region. Finally, the flow ends in block B1165. Also, after block B1160, the drop-pattern-generation device may supply the combined drop pattern to an imprint system, which may deposit drops of formable material onto a substrate in accordance with the combined drop pattern.

FIG. 14 illustrates an example embodiment of an operational flow for identifying uniform-feature segments. The flow starts in block B1400 and then moves to block B1405, where a drop-pattern-generation device obtains a field material map. Then, in block B1410, the drop-pattern-generation device chooses a pixel in the field material map. The flow then proceeds to block B1415, where the drop-pattern-generation device determines whether the chosen pixel has been claimed by a uniform-feature segments (UFS). If the drop-pattern-generation device determines that the chosen pixel has been claimed by UFS (B1415=Yes), then the flow moves to block B1460. If the drop-pattern-generation device determines that the chosen pixel has not been claimed by UFS (B1415=No), then the flow moves to block B1420. Initially none of the pixels in the field material map have been claimed by a UFS, so the result of the first iteration of block B1415 will be the determination that the chosen pixel has not been claimed by a UFS.

In block B1420, the drop-pattern-generation device creates a new UFS, and the chosen pixel (or multiple pixels) is claimed by the UFS. Then, in block B1425, the pixel features (for example feature density and directionality) of the chosen pixel are set as reference features. Also, in block B1430, the chosen pixel is added to a queue for consideration in the UFS.

The flow then proceeds to block B1435, where the drop-pattern-generation device selects the first pixel in the queue for the UFS, which is the chosen pixel in the first iteration of block B1435. Next, in block B1440, the selected pixel is removed from the queue for consideration in the UFS. The flow then advances to block B1445, where the drop-pattern-generation device identifies the adjacent pixels (e.g., the eight abutting pixels) that are similar to the reference features and adds the similar adjacent pixels to the queue for the UFS. For example, a pixel may be similar to the reference features if a threshold percentage (e.g., 80%, 85%, 90%, 95%) of the pixel's features are identical to features that are included in the reference features.

The flow then moves to block B1450, where the drop-pattern-generation device determines if the queue is empty (i.e., determines whether there are no more pixels in the queue). If the drop-pattern-generation device determines that the queue is not empty (B1450=No), then the flow proceeds to block B1455. In block B1455, the drop-pattern-generation device selects the next pixel that is in the queue for the UFS, and then the flow returns to block B1440. If the drop-pattern-generation device determines that the queue is empty (B1450=Yes), then the flow moves to block B1460.

In block B1460, the drop-pattern-generation device determines whether every one of the pixels in the field material map has been chosen. If the drop-pattern-generation device determines that at least one of the pixels has not been chosen (B1460=No), then the flow advances to block B1465. In block B1465, the drop-pattern-generation device chooses the next pixel that has not already been chosen, and then the flow returns to block B1415. If the drop-pattern-generation device determines that every pixel has been chosen (B1460=Yes), then the flow ends in block B1470.

FIG. 15 illustrates an example embodiment of an operational flow for generating a grid drop pattern for a uniform-feature segment. The flow starts in block B1500 and then moves to block B1505, where a drop-pattern-generation device identifies a uniform-feature segment (UFS), for example as described in FIG. 14.

Then, in block B1510, the drop-pattern-generation device determines characteristics of the UFS. Examples of characteristics include feature density and feature dominant orientation (e.g., dominant angle in the plane of the UFS).

Next, in block B1515, the drop-pattern-generation device calculates a target drop density. For example, in some embodiments, the target drop density TDD can be described by the following:

$$TDD = \frac{D}{RH + RLT}, \quad (5)$$

where D is the drop volume of a single drop, where R is the feature density of the UFS, where H is the etch depth of the imprint field, and where RLT is the residual-layer thickness of the UFS. In an alternative embodiment, H is not constant across the imprint field. Also, in an alternative embodiment, RLT is replaced with TLT (top-layer thickness) and H is a function that represent a topography of the substrate across the imprint field.

The flow then proceeds to block B1520, where the drop-pattern-generation device generates candidate grid drop patterns. For example, in the candidate grid drop patterns, drops may be placed every X drop dispense locations in the horizontal direction and every Y drop dispense locations in the vertical direction, where X and Y are integers and may be referred to as GDP strides. Also, in the candidate grid drop patterns, the rows (or columns) may be staggered such that every other row (or column) of drops is shifted by X (or Y) dispense locations relative to the row below (or the column to the left). And staggering may reduce the GDP drop density by a factor of two.

For example, in block B1520, the drop-pattern-generation device may generate candidate grid drop patterns based on every combination of I and J, where I and J are integers that indicate GDP strides, and where $1 \leq I \leq K$ and $1 \leq J \leq K$ (K is the maximum stride).

The flow then advances to block B1525, where the drop-pattern-generation device selects one of the candidate grid drop patterns. For example, the drop-pattern-generation device may select the candidate grid drop pattern that has a drop density that is closest to the target drop density. In some embodiments, the difference Diff between the drop density of a candidate grid drop pattern and the target drop density can be described by the following:

$$Diff = TDD - 2IJG_xG_y, \qquad (6)$$

where I and J are integers that indicate GDP strides, where $G_x$ is the dispense grid spacing in the horizontal direction, and where $G_y$ is the dispense grid spacing in the vertical direction.

Also, the stride combination I, J and the stride combination J, I can both produce the difference Diff. Thus, for the GDP strides I and J of the difference Diff that is the lowest, to select whether to use the stride combination I, J or, alternatively, the stride combination J, I, the drop-pattern-generation device can make the selection based on the feature dominant orientation of the UFS. For example, if the feature dominant orientation is more vertical (the Y direction), then the X stride of the GDP may be set to the larger of I and J and the Y stride may be set to the lower of I and J. And if the feature dominant orientation is more horizontal (the X direction), then the Y stride of the GDP may be set to the larger of I and J and the X stride may be set to the lower of I and J. This may maximize the use of capillary forces in the spreading of the drops because the drops spread faster along the feature dominant orientation.

Figure 16:
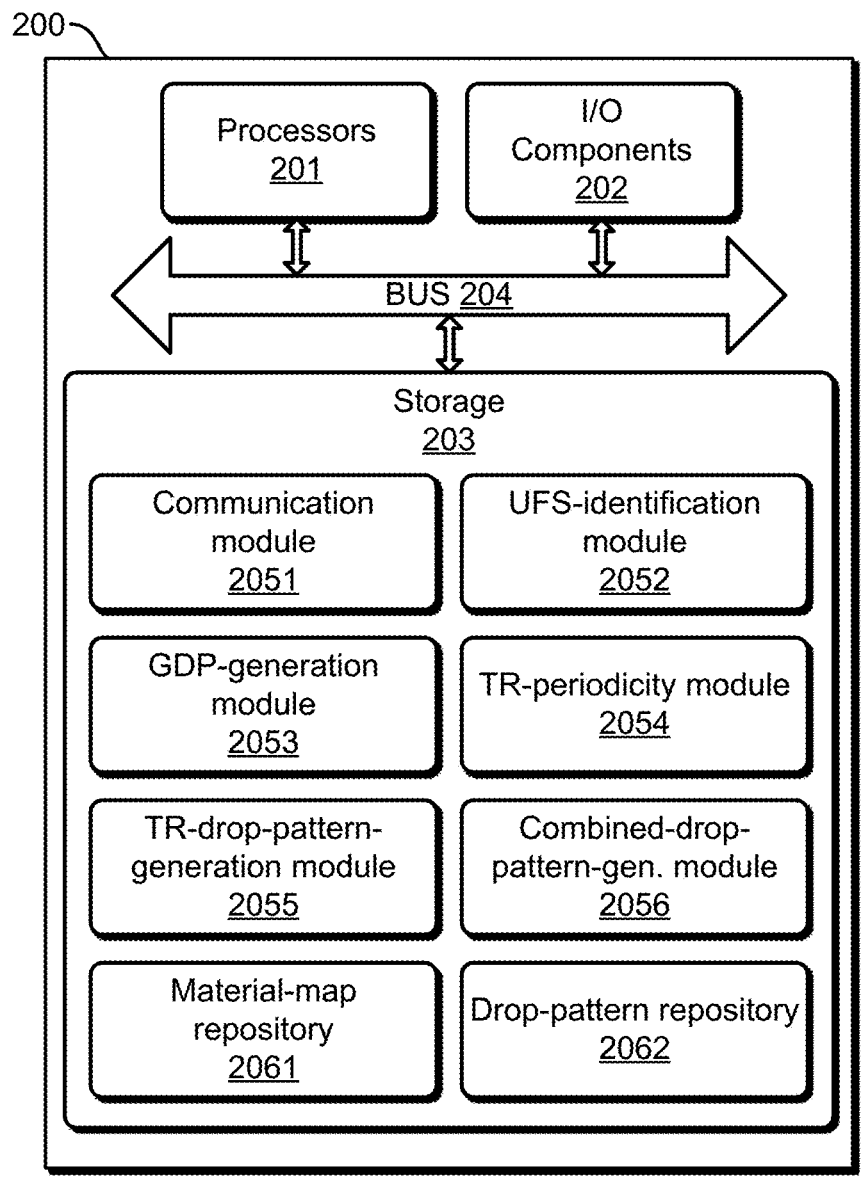
FIG. 16 illustrates an example embodiment of a drop-pattern-generation device.

FIG. 16 illustrates an example embodiment of a drop-pattern-generation device. The drop-pattern-generation device 200 includes one or more processors 201, one or more I/O components 202, and storage 203. Also, the hardware components of the drop-pattern-generation device 200 communicate via one or more buses 204 or other electrical connections. Examples of buses 204 include a universal serial bus (USB), an IEEE 1394 bus, a Peripheral Component Interconnect (PCI) bus, a Peripheral Component Interconnect Express (PCIe) bus, an Accelerated Graphics Port (AGP) bus, a Serial AT Attachment (SATA) bus, and a Small Computer System Interface (SCSI) bus.

The one or more processors 201 include one or more central processing units (CPUs), which may include one or more microprocessors (e.g., a single core microprocessor, a multi-core microprocessor); one or more graphics processing units (GPUs); one or more tensor processing units (TPUs); one or more application-specific integrated circuits (ASICs); one or more field-programmable-gate arrays (FPGAs); one or more digital signal processors (DSPs); or other electronic circuitry (e.g., other integrated circuits). The I/O components 202 include communication components (e.g., a graphics card, a network-interface controller) that communicate with a network, with a lithography-control device 175, or with input or output devices (not illustrated), for example a display device, a keyboard, a mouse, a printing device, a touch screen, a light pen, an optical-storage device, a scanner, a microphone, a drive, a joystick, and a control pad.

The storage 203 includes one or more computer-readable storage media. As used herein, a computer-readable storage medium includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). The storage 203, which may include both ROM and RAM, can store computer-readable data or computer-executable instructions.

The drop-pattern-generation device 200 also includes a communication module 2051, a uniform-feature-segment-identification (UFS-identification) module 2052, a grid-drop-pattern-generation (GDP-generation) module 2053, a transition-region-periodicity (TR-periodicity) module 2054, a transition-region-drop-pattern-generation (TR-drop-pattern-generation) module 2055, and a combined-drop-pattern-generation module 2056. A module includes logic, computer-readable data, or computer-executable instructions. In the embodiment shown in FIG. 16, the modules are implemented in software (e.g., Assembly, C, C++, C #, Java, JavaScript, BASIC, Perl, Visual Basic, Python). However, in some embodiments, the modules are implemented in hardware (e.g., customized circuitry) or, alternatively, a combination of software and hardware. When the modules are implemented, at least in part, in software, then the software can be stored in the storage 203. Also, some embodiments of the drop-pattern-generation device 200 include additional modules, omit some of these modules, combine these modules into fewer modules, or divide these modules into more modules. Additionally, the drop-pattern-generation device 200 includes a material-map repository 2061 and a drop-pattern repository 2062. The material-map repository 2061 stores field material maps, and the drop-pattern repository 2062 stores drop patterns (e.g., grid drop patterns, transition-region drop patterns, combined drop patterns).

The communication module 2051 includes instructions that cause the drop-pattern-generation device 200 to communicate with users (via input and output devices) or with other devices (e.g., a lithography-control device) and to obtain drop volumes, obtain field material maps, obtain target residual-layer thicknesses, obtain target top-layer thicknesses, obtain etch depths, obtain segment-edge-exclusion distances, obtain compensation factors, and obtain weighting factors. For example, some embodiments of the communication module 2051 include instructions that cause the applicable components (e.g., the processors 201, the I/O components 202, the storage 203) of the drop-pattern-generation device 200 to perform at least some of the operations that are described in blocks B505-B510 in FIG. 5, in blocks B705-B710 in FIG. 7, in block B1005 in FIG. 10, in block B1105 in FIG. 11, and in block B1405 in FIG. 14. Also, the applicable components of the drop-pattern-generation device 200 operating according to the communication module 2051 realize an example of a communication unit.

The UFS-identification module 2052 includes instructions that cause the drop-pattern-generation device 200 to identify uniform-feature segments and transition regions in field material maps. For example, some embodiments of the UFS-identification module 2052 include instructions that cause the applicable components (e.g., the processors 201, the I/O components 202, the storage 203) of the drop-pattern-generation device 200 to perform at least some of the operations that are described in block B515 in FIG. 5, in block B715 in FIG. 7, in block B1010 in FIG. 10, in block B1110 in FIG. 11, and in blocks B1410-B1465 in FIG. 14. Also, the applicable components of the drop-pattern-generation device 200 operating according to the UFS-identification module 2052 realize an example of a UFS-identification unit.

The GDP-generation module 2053 includes instructions that cause the drop-pattern-generation device 200 to select or generate grid drop patterns for uniform-feature segments. For example, some embodiments of the GDP-generation module 2053 include instructions that cause the applicable components (e.g., the processors 201, the I/O components 202, the storage 203) of the drop-pattern-generation device 200 to perform at least some of the operations that are described in block B520 in FIG. 5, in block B1015 in FIG. 10, in block B1115 in FIG. 11, and in blocks B1505-B1525 in FIG. 15. Also, the applicable components of the drop-pattern-generation device 200 operating according to the GDP-generation module 2053 realize an example of a GDP-generation unit.

The TR-periodicity module 2054 includes instructions that cause the drop-pattern-generation device 200 to determine periodicities of transition regions and to determine periodic elements of transition regions. For example, some embodiments of the TR-periodicity module 2054 include instructions that cause the applicable components (e.g., the processors 201, the I/O components 202, the storage 203) of the drop-pattern-generation device 200 to perform at least some of the operations that are described in blocks B720-B725 in FIG. 7, in blocks B1025-B1030 in FIG. 10, and in block B1135 in FIG. 11. Also, the applicable components of the drop-pattern-generation device 200 operating according to the TR-periodicity module 2054 realize an example of a TR-periodicity unit.

The TR-drop-pattern-generation module 2055 includes instructions that cause the drop-pattern-generation device 200 to generate drop patterns for transition regions, which may include generating drop patterns for periodic elements of transition regions. For example, some embodiments of the TR-drop-pattern-generation module 2055 include instructions that cause the applicable components (e.g., the processors 201, the 1/O components 202, the storage 203) of the drop-pattern-generation device 200 to perform at least some of the operations that are described in blocks B525-B530 in FIG. 5, in blocks B730-B740 in FIG. 7, in blocks B1035-B1045 in FIG. 10, and in blocks B1140-B1155 in FIG. 11. Also, the applicable components of the drop-pattern-generation device 200 operating according to the TR-drop-pattern-generation module 2055 realize an example of a TR-drop-pattern-generation unit.

The combined-drop-pattern-generation module 2056 includes instructions that cause the drop-pattern-generation device 200 to generate combined drop patterns based on transition-region drop patterns and on grid drop patterns. For example, some embodiments of the combined-drop-pattern-generation module 2056 include instructions that cause the applicable components (e.g., the processors 201, the I/O components 202, the storage 203) of the drop-pattern-generation device 200 to perform at least some of the operations that are described in block B535 in FIG. 5, in block B745 in FIG. 7, in block B1050 in FIG. 10, and in block B1160 in FIG. 11. Also, the applicable components of the drop-pattern-generation device 200 operating according to the combined-drop-pattern-generation module 2056 realize an example of a combined-drop-pattern-generation unit.

Figure 17:
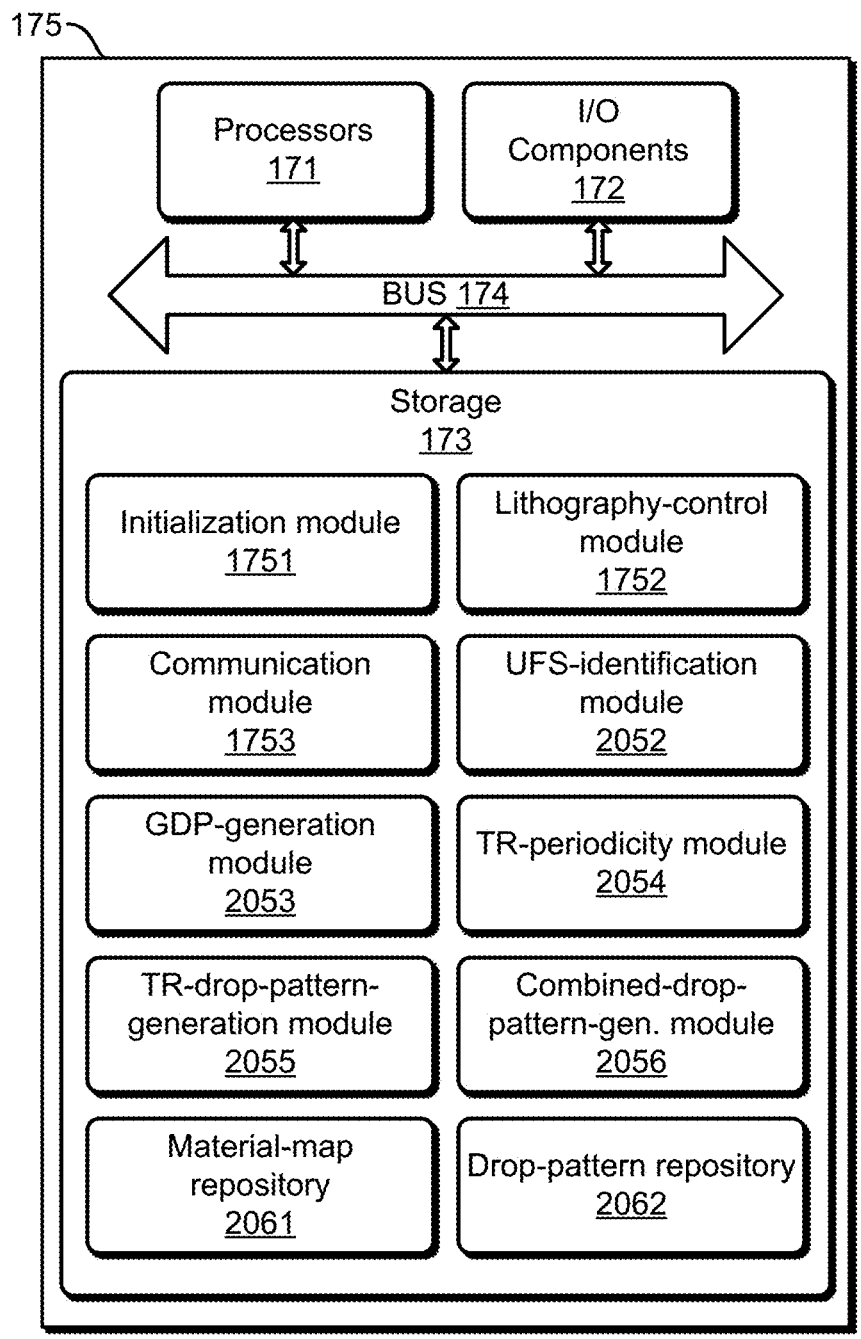
FIG. 17 illustrates an example embodiment of a lithography-control device.

FIG. 17 illustrates an example embodiment of a lithography-control device. This embodiment of a lithography-control device 175 is also configured to operate as a drop-pattern generation device. And the I/O components 172 of the lithography-control device 175 include communication components that communicate with a substrate positioning stage, an imprint head, a fluid dispenser, or other components of an imprint system.

The lithography-control device 175 includes an initialization module 1751, a lithography-control module 1752, a communication module 1753, a uniform-feature-segment-identification (UFS-identification) module 2052, a grid-drop-pattern-generation (GDP-generation) module 2053, a transition-region-periodicity (TR-periodicity) module 2054, a transition-region-drop-pattern-generation (TR-drop-pattern-generation) module 2055, a combined-drop-pattern-generation module 2056, a material-map repository 2061, and a drop-pattern repository 2062.

The UFS-identification module 2052, the GDP-generation module 2053, the TR-periodicity module 2054, the TR-drop-pattern-generation module 2055, and the combined-drop-pattern-generation module 2056 are similar to the modules in FIG. 16. However, in FIG. 17, the UFS-identification module 2052, the GDP-generation module 2053, the TR-periodicity module 2054, the TR-drop-pattern-generation module 2055, and the combined-drop-pattern-generation module 2056 include instructions that cause the applicable components (e.g., the processors 171, the I/O components 172, the storage 173) of the lithography-control device 175 to perform the operations.

The initialization module 1751 includes instructions that cause the lithography-control device 175 to perform initialization operations, for example the calibration of other components or subsystems of an imprint system.

The lithography-control module 1752 includes instructions that cause the lithography-control device 175 to regulate, control, or direct other components or subsystems of an imprint system (e.g., a substrate positioning stage, an imprint head, a fluid dispenser, an energy source, and a camera) to perform imprinting processes.

The communication module 1753 includes instructions that cause the lithography-control device 175 to communicate with one or more other devices, as well as to perform the operations that are performed by the communication module 2051 in FIG. 16.

At least some of the above-described devices, systems, and methods can be implemented, at least in part, by providing one or more computer-readable media that contain computer-executable instructions for realizing the above-described operations to one or more computing devices that are configured to read and execute the computer-executable instructions. The systems or devices perform the operations of the above-described embodiments when executing the computer-executable instructions. Also, an operating system on the one or more systems or devices may implement at least some of the operations of the above-described embodiments.

Furthermore, some embodiments use one or more functional units to implement the above-described devices, systems, and methods. The functional units may be implemented in only hardware (e.g., customized circuitry) or in a combination of software and hardware (e.g., a microprocessor that executes software).

The invention claimed is:
1. A drop-pattern-generation method that includes determining positions of drops in a transition region between a first uniform-feature segment and a second uniform-feature segment, the method comprising:
  calculating a transition region periodicity as a least a common multiple of a first periodicity of a first uniform-feature segment and a second periodicity of a second uniform-feature segment;
  determining a plurality of periodic elements of the transition region based on the transition region periodicity;
  determining a number of drops for each periodic element of the plurality of periodic elements of the transition region based on a volume requirement of the periodic element; and
  selecting, for each periodic element of the plurality of periodic elements of the transition region, a transition-region drop pattern that has the number of drops and that minimizes a metric that is a weighted sum of inverse distances between drops in the periodic element and drops in the first uniform-feature segment and the second uniform-feature segment that are adjacent to the periodic element.

2. The drop-pattern-generation method of claim 1, further comprising:
  depositing drops of formable material on a substrate in accordance with the transition-region drop pattern.

3. The drop-pattern-generation method of claim 1, wherein selecting the transition-region drop pattern includes:
  generating a plurality of candidate transition-region drop patterns; and
  selecting the transition-region drop pattern from the plurality of candidate transition-region drop patterns based on the metric.

4. The drop-pattern-generation method of claim 1, wherein the first uniform-feature segment and the second uniform-feature segment are grid patterns.

5. The drop-pattern-generation method of claim 1, wherein a width of the transition region is two or more times a dispensable-location pitch.

6. The drop-pattern-generation method of claim 1, wherein the metric is based on a first weight for distances between drops in the periodic element and a second weight for distances between (1) drops in the periodic element and drops in the first uniform-feature segment and (2) drops in the periodic element and drops and the second uniform-feature segment.

7. The drop-pattern-generation method of claim 1, further comprising:
  supplying formable material to a substrate in accordance with the transition-region drop pattern;
  imprinting the formable material on the substrate with a template; and
  manufacturing an article by processing the substrate on which the formable material has been imprinted.

8. A system comprising:
  one or more computer-readable media; and
  one or more processors in communication with the one or more computer-readable media, wherein the one or more processors and the one or more computer-readable media are configured to:
    calculate a number of drops for at least part of a transition region based on a volumetric requirement of the at least part of the transition region and a drop volume, wherein the transition region is a region between a first uniform-feature segment and a second uniform-feature segment; and
    generate a transition-region drop pattern that has the number of drops and that maximizes distances between drops in the at least part of the transition region,
    drops in a first drop pattern, of the first uniform-feature segment, that are adjacent to the at least part of the transition region, and
    drops in a second drop pattern, of the second uniform-feature segment, that are adjacent to the at least part of the transition region.

9. The system of claim 8, wherein, to generate the transition-region drop pattern, the one or more processors and the one or more computer-readable media are further configured to:
  generate a plurality of candidate transition-region drop patterns; and
  select the transition-region drop pattern from the plurality of candidate transition-region drop patterns based on a metric,
  wherein the metric is based on distances between the drops in the at least part of the transition region, the drops in the first drop pattern, of the first uniform-feature segment, that are adjacent to the at least part of the transition region, and the drops in the second drop pattern, of the second uniform-feature segment, that are adjacent to the at least part of the transition region.

10. The system of claim 9, wherein the metric is inversely related to the respective distances between each drop of the drops in the at least part of the transition region and every other drop of the drops in the at least part of the transition region.

11. The system of claim 10, wherein the metric is inversely related to the respective distances between each drop of the drops in the at least part of the transition region and each of the drops in the first drop pattern that are adjacent to the at least part of the transition region and the respective distances between each drop of the drops in the at least part of the transition region and each of the drops in the second drop pattern that are adjacent to the at least part of the transition region.

12. The system of claim 11, wherein the respective distances between each drop of the drops in the at least part of the transition region and every other drop of the drops in the at least part of the transition region are weighted according to a first weight, and
  wherein the respective distances between each drop of the drops in the at least part of the transition region and each of the drops in the first drop pattern that are adjacent to the at least part of the transition region and the respective distances between each drop of the drops in the at least part of the transition region and each of the drops in the second drop pattern that are adjacent to the at least part of the transition region are weighted according to a second weight.

13. The system of claim 12, wherein the first weight is different from the second weight.

14. The system of claim 8, wherein the at least part of the transition region has a length that is equal to a distance along the transition region in which the drop arrangements of the first drop pattern and the second drop pattern do not repeat.

15. The system of claim 8, wherein the one or more processors and the one or more computer-readable media are further configured to:
  control a dispenser and a substrate stage to deposit drops of formable material on a substrate in accordance with the transition-region drop pattern.

16. A method comprising:
  selecting a part of a transition region, wherein the transition region is a region between a first uniform-feature segment and a second uniform-feature segment, and wherein the selecting is based on a first drop pattern of the first uniform-feature segment and on a second drop pattern of the second uniform-feature segment, and wherein the part of the transition region has a length that is equal to an integer multiple of both a periodicity of the first drop pattern and a periodicity of the second drop pattern;

calculating a number of drops for the part of a transition region based on a volumetric requirement of the part of the transition region and on a drop volume; and generating a transition-region drop pattern that is based on the number of drops and that maximizes distances between
- drops in the part of the transition region,
- drops in the first drop pattern that are adjacent to the part of the transition region, and
- drops in the second drop pattern that are adjacent to the part of the transition region.

17. The method of claim 16, wherein generating the transition-region drop pattern includes:

generating a plurality of candidate transition-region drop patterns; and selecting the transition-region drop pattern from the plurality of candidate transition-region drop patterns based on a metric, wherein the metric is based on distances between the drops in the part of the transition region, the drops in the first drop pattern that are adjacent to the part of the transition region, and the drops in the second drop pattern that are adjacent to the part of the transition region.

18. The method of claim 17, wherein the distances between the drops in the part of the transition region, the drops in the first drop pattern that are adjacent to the part of the transition region, and the drops in the second drop pattern that are adjacent to the part of the transition region include:

a respective distance between each drop of the drops in the part of the transition region and every other drop of the drops in the part of the transition region;

a respective distance between each drop of the drops in the part of the transition region and each of the drops in the first drop pattern that are adjacent to the part of the transition region; and a respective distance between each drop of the drops in the part of the transition region and each of the drops in the second drop pattern that are adjacent to the part of the transition region.

19. The method of claim 18, wherein the respective distances between each drop of the drops in the part of the transition region and every other drop of the drops in the part of the transition region are weighted according to a first weight, and wherein the respective distances between each drop of the drops in the part of the transition region and each of the drops in the first drop pattern that are adjacent to the part of the transition region and the respective distances between each drop of the drops in the part of the transition region and each of the drops in the second drop pattern that are adjacent to the part of the transition region are weighted according to a second weight.

20. The method of claim 16, wherein a width of the transition region is two to seven times a width of a dispense grid.

* * * * *